(12) United States Patent
An et al.

(10) Patent No.: US 12,494,406 B2
(45) Date of Patent: Dec. 9, 2025

(54) SEMICONDUCTOR PACKAGE AND METHOD OF PROVIDING SURFACE TEMPERATURE OF SEMICONDUCTOR PACKAGE

(71) Applicant: SAMSUNG ELECTRONICS CO., LTD., Suwon-si (KR)

(72) Inventors: Sangmin An, Suwon-si (KR); Sukyoung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 430 days.

(21) Appl. No.: 18/133,178

(22) Filed: Apr. 11, 2023

(65) Prior Publication Data
US 2023/0402341 A1    Dec. 14, 2023

(30) Foreign Application Priority Data

Jun. 8, 2022    (KR) ........................ 10-2022-0069240

(51) Int. Cl.
*H01L 23/34*    (2006.01)
*H01L 21/66*    (2006.01)
*H01L 23/31*    (2006.01)

(52) U.S. Cl.
CPC .............. *H01L 23/34* (2013.01); *H01L 22/12* (2013.01); *H01L 23/3121* (2013.01)

(58) Field of Classification Search
CPC ......... H01L 22/12; H01L 22/20; H01L 25/18; H01L 23/34; H01L 23/3121; H01L 23/3107; G01R 31/2875
See application file for complete search history.

(56) References Cited

U.S. PATENT DOCUMENTS

| | | | |
|---|---|---|---|
| 7,643,889 B2 | 1/2010 | Jeong et al. | |
| 9,006,000 B2 | 4/2015 | Hanan et al. | |
| 9,797,619 B2 | 10/2017 | Aljabari et al. | |
| 9,927,266 B2 | 3/2018 | Dawson et al. | |

(Continued)

FOREIGN PATENT DOCUMENTS

| | | |
|---|---|---|
| JP | 2013-124969 A | 6/2013 |
| KR | 10-0851989 B1 | 8/2008 |
| KR | 10-2021-0115391 A | 9/2021 |

*Primary Examiner* — Omar F Mojaddedi

(74) *Attorney, Agent, or Firm* — Sughrue Mion, PLLC

(57) ABSTRACT

A method of providing a surface temperature of a semiconductor package including a semiconductor die that is packaged using a molding material includes setting an air temperature near the semiconductor package to each of reference temperatures, measuring reference code values respectively corresponding to the reference temperatures based on a temperature code indicating a junction temperature in the semiconductor die while the air temperature is set to each of the reference temperatures, the temperature code being provided from a reference temperature measurement circuit integrated in the semiconductor package, generating calibration information that indicates mapping relationships between the reference temperatures and the reference code values, and providing a present surface temperature of the semiconductor package based on the calibration information and a present code value of the temperature code.

20 Claims, 18 Drawing Sheets

(56) References Cited

U.S. PATENT DOCUMENTS

| | | | |
|---|---|---|---|
| 2012/0133427 A1* | 5/2012 | Kim | H01L 25/16 |
| | | | 327/564 |
| 2013/0166093 A1* | 6/2013 | Kim | H01L 23/34 |
| | | | 700/299 |
| 2013/0295697 A1* | 11/2013 | Hanan | G01R 31/2884 |
| | | | 257/E21.53 |
| 2013/0321041 A1* | 12/2013 | Kim | G06F 1/324 |
| | | | 327/113 |
| 2014/0254092 A1* | 9/2014 | Im | H01L 25/18 |
| | | | 361/688 |
| 2018/0259985 A1* | 9/2018 | Im | H05K 7/20 |
| 2019/0339137 A1 | 11/2019 | Krishnaswamy et al. | |

* cited by examiner

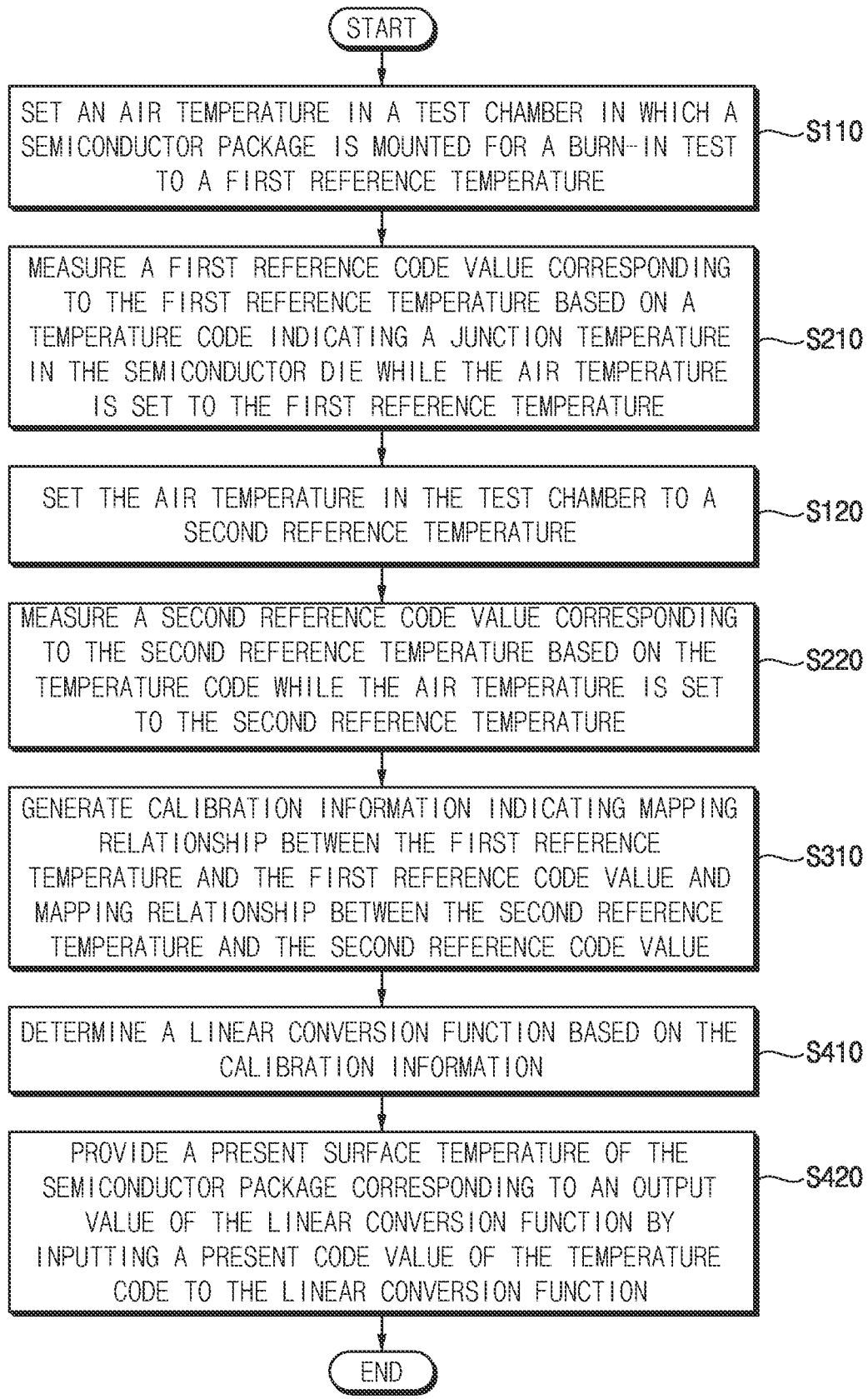

FIG. 21
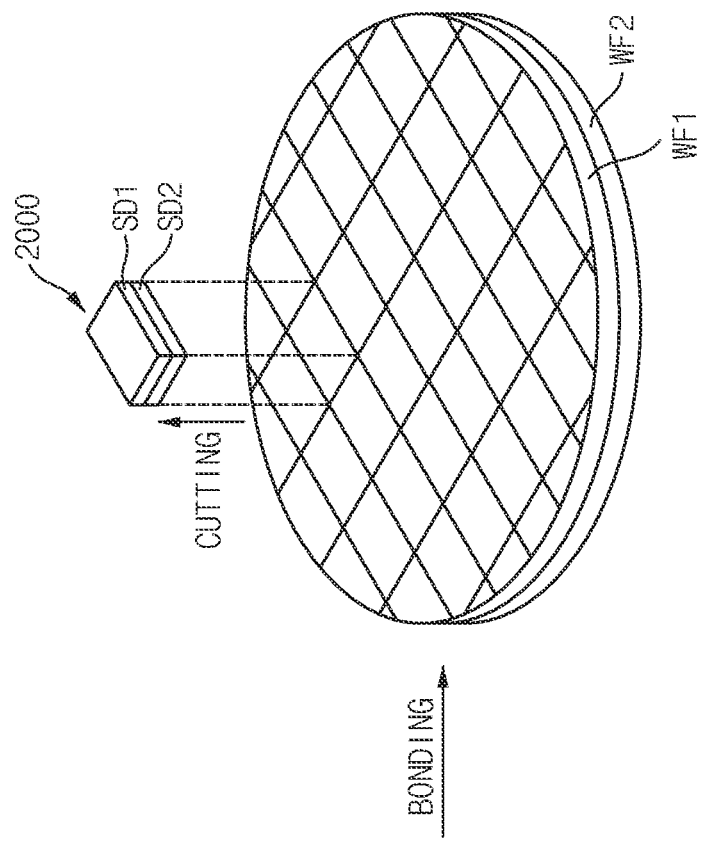
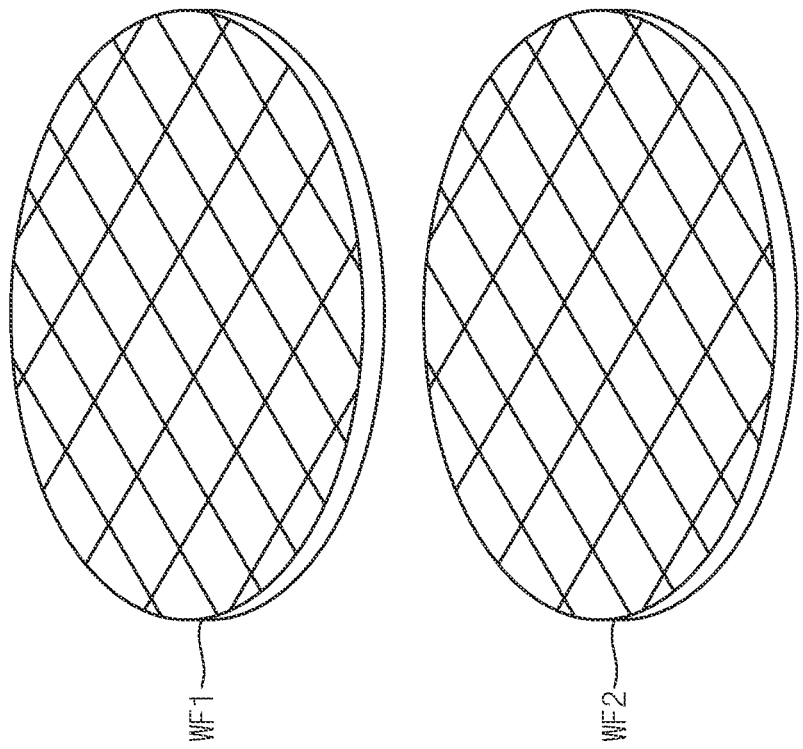

SEMICONDUCTOR PACKAGE AND METHOD OF PROVIDING SURFACE TEMPERATURE OF SEMICONDUCTOR PACKAGE

CROSS-REFERENCE TO RELATED APPLICATION

This U.S. non-provisional application claims priority under 35 USC § 119 to Korean Patent Application No. 10-2022-0069240, filed on Jun. 8, 2022, in the Korean Intellectual Property Office (KIPO), the disclosure of which is incorporated by reference herein in its entirety.

BACKGROUND

Example embodiments relate generally to semiconductor integrated circuits, and more particularly to a semiconductor package and a method of providing a surface temperature of a semiconductor package.

Semiconductor devices are tested to ensure their reliability, and only products that are determined to be good products through the tests are sold. These tests are often performed under severe thermal and/or electrical conditions, and test apparatus may include a high-temperature chamber to create a high-temperature atmosphere.

A wafer on which predetermined integrated circuits is formed may be divided into semiconductor chips, and a semiconductor package may be completed through an assembly process. Completed semiconductor packages may be classified into normal and defective products through various tests, and reliability of the product may be ensured through this process.

A test of a semiconductor package is performed at constant test temperatures, and there is a certain test temperature regulation for each semiconductor package. If the surface temperature of the semiconductor package during the test does not satisfy the test temperature regulation, a defective product may be mistakenly determined as a normal product. Therefore, it is required to provide an accurate surface temperature of a semiconductor package in order to improve test accuracy.

SUMMARY

It is an aspect to provide a semiconductor package and a method, capable of efficiently providing a surface temperature of the semiconductor package.

According to an aspect of one or more example embodiments, there is provided a method of providing a surface temperature of a semiconductor package including at least one semiconductor die that is packaged using a molding material, the method comprising setting an air temperature near the semiconductor package to each of a plurality of reference temperatures; measuring a plurality of reference code values respectively corresponding to the plurality of reference temperatures based on a temperature code indicating a junction temperature in the at least one semiconductor die while the air temperature is set to each of the plurality of reference temperatures, the temperature code being provided from a reference temperature measurement circuit integrated in the semiconductor package; generating calibration information that indicates mapping relationships between the plurality of reference temperatures and the plurality of reference code values; and providing a present surface temperature of the semiconductor package based on the calibration information and a present code value of the temperature code.

According to another aspect of one or more example embodiments, there is provided a method of providing a surface temperature of a semiconductor package including at least one semiconductor die that is packaged using molding material, the method comprising setting an air temperature in a test chamber in which the semiconductor package is mounted for a burn-in test to a first reference temperature; measuring a first reference code value corresponding to the first reference temperature based on a temperature code indicating a junction temperature in the at least one semiconductor die while the air temperature is set to the first reference temperature, the temperature code being provided from a reference temperature measurement circuit integrated in the semiconductor package; setting the air temperature in the test chamber to a second reference temperature; measuring a second reference code value corresponding to the second reference temperature based on the temperature code while the air temperature is set to the second reference temperature; generating calibration information indicating a first mapping relationship between the first reference temperature and the first reference code value and a second mapping relationship between the second reference temperature and the second reference code value; determining a linear conversion function based on the calibration information; inputting a present code value of the temperature code to the linear conversion function and receiving an output value from the linear conversion function; and providing a present surface temperature of the semiconductor package corresponding to the output value of the linear conversion function.

According to yet another aspect of one or more example embodiments, there is provided a semiconductor package comprising a base substrate; at least one semiconductor die stacked on the base substrate; molding material covering the base substrate and the at least one semiconductor die; a reference temperature measurement circuit integrated in the at least one semiconductor die and configured to generate a temperature code indicating a junction temperature in the at least one semiconductor die; and a calibration logic configured to generate a present surface temperature of the molding material based on a present reference code value of the temperature code and calibration information indicating mapping relationships between a plurality of reference temperatures and a plurality of reference code values of the temperature code respectively corresponding to the plurality of reference temperatures.

BRIEF DESCRIPTION OF THE DRAWINGS

Example embodiments will be more clearly understood from the following detailed description taken in conjunction with the accompanying drawings.

FIG. 11 is a flowchart illustrating a method of providing a surface temperature of a semiconductor package according to some example embodiments.

FIG. 21 is a conceptual diagram illustrating manufacturing processes of the nonvolatile memory device of FIG. 20, according to some example embodiments.

DETAILED DESCRIPTION

Figure 1:
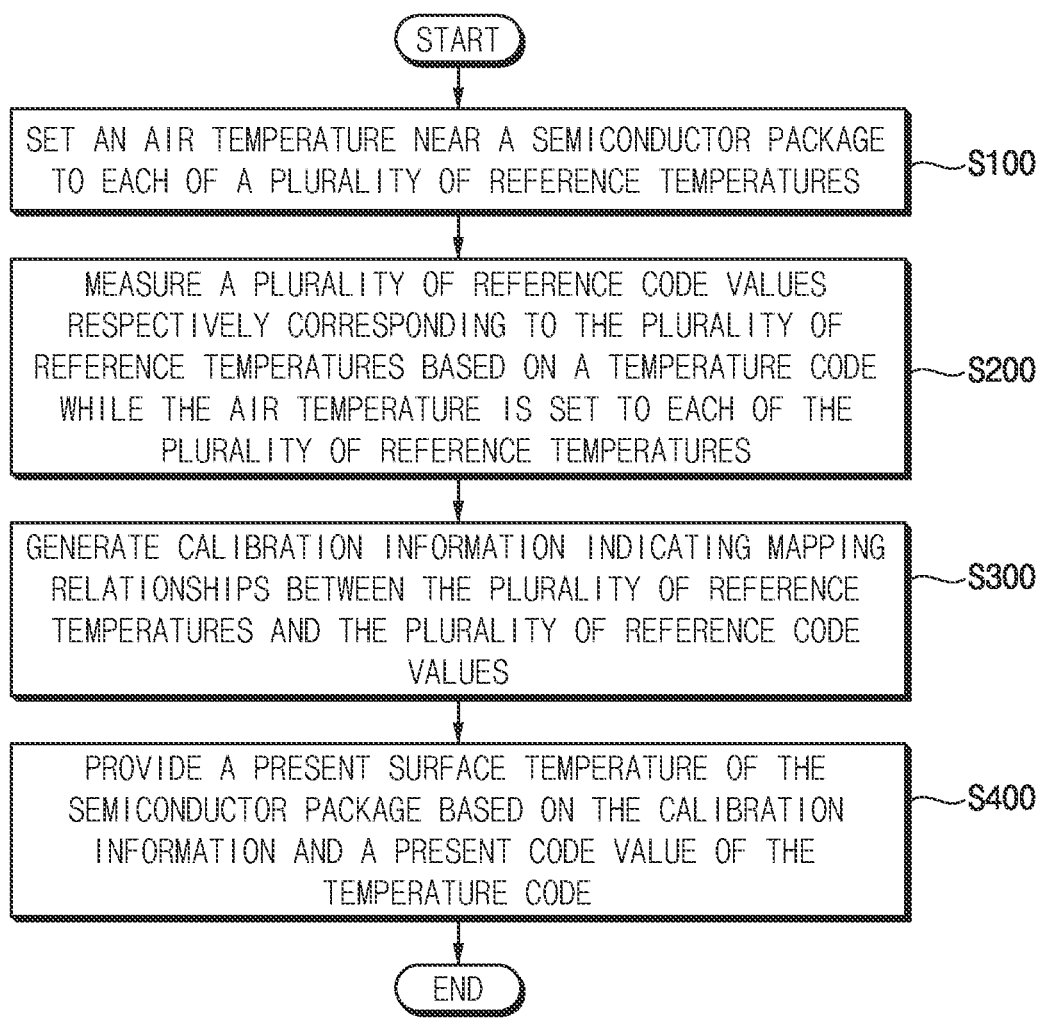
FIG. 1 is a flowchart illustrating a method of providing a surface temperature of a semiconductor package according to some example embodiments.

Various example embodiments will be described more fully hereinafter with reference to the accompanying drawings, in which some example embodiments are shown. In the drawings, like numerals refer to like elements throughout. The repeated descriptions may be omitted.

The semiconductor package and the method of providing the surface temperature of the semiconductor package according to some example embodiments may provide the surface temperature efficiently and accurately based on the calibration information indicating the mapping relationships between the plurality of reference temperatures and the plurality of reference code values. In addition, the accurate surface temperature may be provided by generating the calibration information corresponding to each semiconductor package using the temperature measurement circuit integrated in the semiconductor die of each semiconductor package without an additional temperature sensor to measure the surface temperature. Further, the surface temperature may be provided efficiently without excessive increase in test time by generating the calibration information at the test temperatures during the burn-in test.

FIG. 1 is a flowchart illustrating a method of providing a surface temperature of a semiconductor package according to example embodiments.

Referring to FIG. 1, an air temperature near a semiconductor package may be set to each of a plurality of reference temperatures (S100). As will be described below with reference to FIGS. 2, 15 and 16, in some example embodiments, the semiconductor device may be a single device including at least one semiconductor die that is packaged using molding material.

A plurality of reference code values respectively corresponding to the plurality of reference temperatures may be measured based on a temperature code while the air temperature is set to each of the plurality of reference temperatures (S200). As will be described below with reference to FIGS. 3 and 4, in some example embodiments, the temperature code may be provided from a reference temperature measurement circuit integrated in the semiconductor package and the temperature code may indicate a junction temperature in the at least one semiconductor die.

Calibration information may be generated indicating mapping relationships between the plurality of reference temperatures and the plurality of reference code values (S300). In some example embodiments, the calibration information may be stored inside the semiconductor package. In some example embodiments, the calibration information may be stored in an external apparatus such as a test apparatus and provided to the semiconductor package from the external apparatus when the calibration information is required by the semiconductor package.

A present surface temperature of the semiconductor package may be provided based on the calibration information and a present code value of the temperature code (S400). In some example embodiments, as will be described below with reference to FIGS. 6 and 13, a conversion function may be determined based on the calibration information and the present surface temperature may be provided using the conversion function. The present surface temperature may correspond to an output value of the conversion function by inputting a present code value of the temperature code to the conversion function. In other words, the present code value of the temperature code may be input to the conversion function, and the conversion function may output an output value, and the present surface temperature that is provided may correspond to the output value. In some example embodiments, the conversion function may be a linear function.

As such, the semiconductor package and the method of providing the surface temperature of the semiconductor package according to example embodiments may provide the surface temperature efficiently and accurately based on the calibration information indicating the mapping relationships between the plurality of reference temperatures and the plurality of reference code values. In addition, the accurate surface temperature may be provided by generating the calibration information corresponding to each semiconductor package using the temperature measurement circuit integrated in the semiconductor die of each semiconductor package without an additional temperature sensor to measure the surface temperature.

Figure 2:
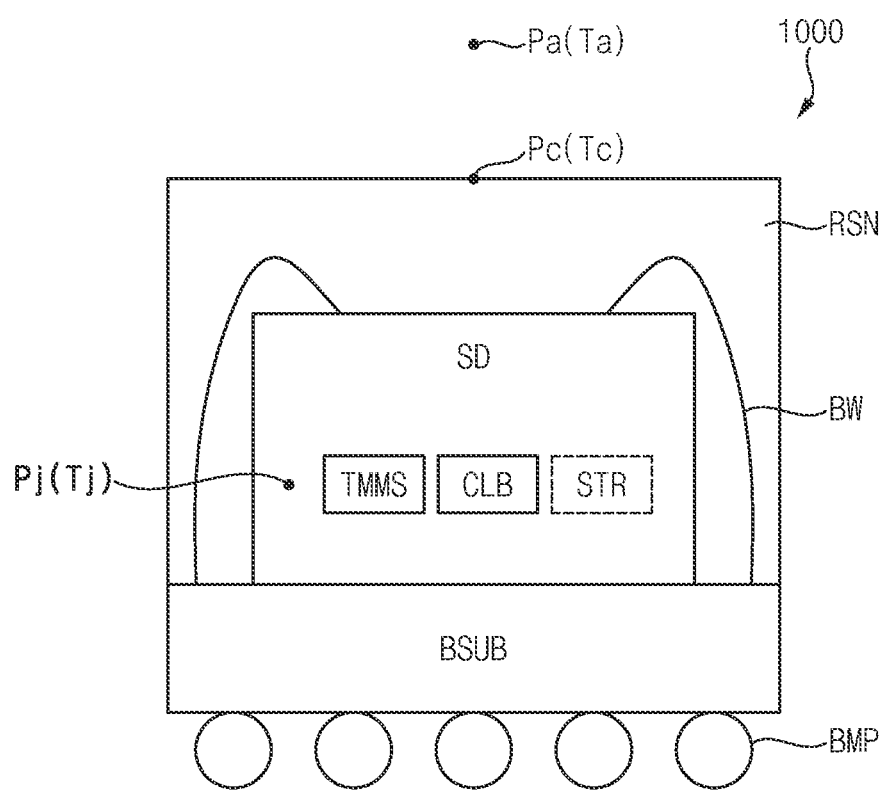
FIG. 2 is a diagram illustrating a semiconductor package according to some example embodiments.

FIG. 2 is a diagram illustrating a semiconductor package according to example embodiments.

Referring to FIG. 2, a semiconductor package 1000 may include a base substrate BSUB and at least one semiconductor die SD stacked on the base substrate BSUB. The semiconductor die SD may be packaged using a molding material (e.g., resin) RSN covering the base substrate BSUB and the at least one semiconductor die SD. FIG. 2 illustrates one semiconductor die SD for convenience of illustration, but example embodiments are not limited thereto. As will be described below with reference to FIGS. 15 and 16, the semiconductor package 1000 may include a plurality of semiconductor dies that are homogeneous or heterogeneous.

Even though not illustrated in FIG. 2, in some example embodiments, various circuits according to unique functions of the semiconductor package 1000 may be integrated in the semiconductor die SD. In some example embodiments, the semiconductor die SD may include a surface temperature provision circuit to perform the method according to example embodiments. The surface temperature provision circuit may include a reference temperature measurement circuit TMMS and a calibration logic CLB.

The reference temperature measurement circuit TMMS may be integrated in the semiconductor die SD and generate a temperature code indicating a junction temperature Pj at a junction location Pj in the semiconductor die SD. The calibration logic CLB may generate a present surface temperature Tc, for example, at a surface location Pc of the molding material RSN based on a present reference code value of the temperature code and calibration information. The calibration logic CLB may be implemented as a hardware logic circuit or a software program that is executed by a processor included in the semiconductor die SD.

As described with reference to FIG. 1, the plurality of reference code values respectively corresponding to the plurality of reference temperatures may be measured based on the temperature code indicating the junction temperature Tj while the air temperature Ta at the location Pa near the semiconductor package 1000 is set to each of the plurality of reference temperatures. The calibration information may indicate mapping relationships between the plurality of reference temperatures and the plurality of reference code values of the temperature code. In some example embodiments, the surface temperature provision circuit may further include a nonvolatile memory STR to store the calibration information.

Figure 3:
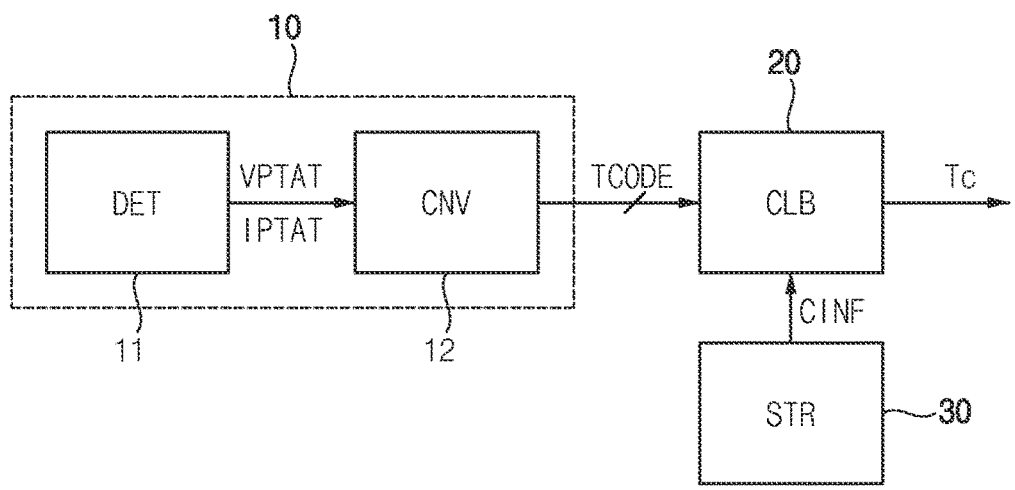
FIG. 3 is a block diagram illustrating an example embodiment of a surface temperature provision circuit included in a semiconductor package according to some example embodiments.
Figure 4:
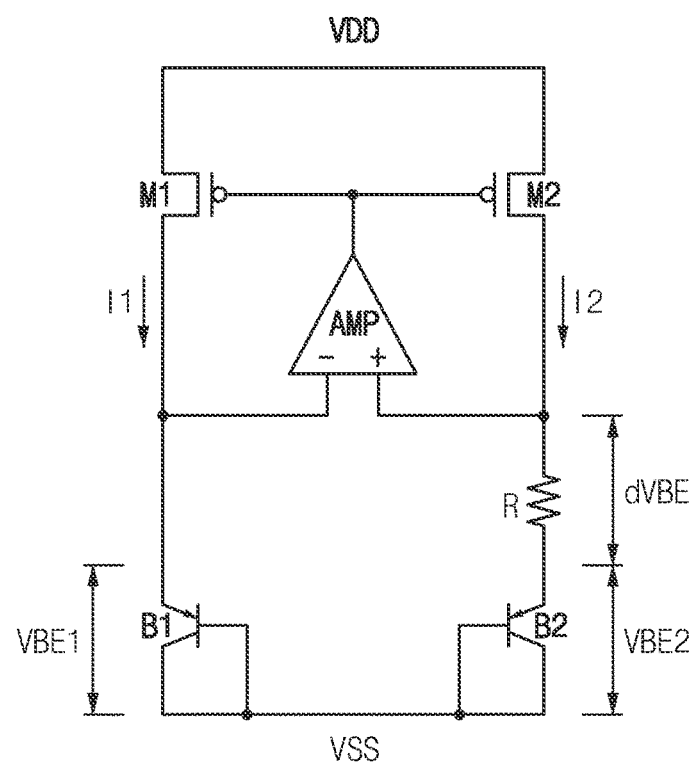
FIG. 4 is a circuit diagram illustrating an example embodiment of a temperature detector included in the surface temperature provision circuit of FIG. 3.

FIG. 3 is a block diagram illustrating an example embodiment of a surface temperature provision circuit included in a semiconductor package according to some example embodiments, and FIG. 4 is a circuit diagram illustrating an example embodiment of a temperature detector included in the surface temperature provision circuit of FIG. 3.

Referring to FIG. 3, a surface temperature provision circuit 50 may include a reference temperature measurement circuit 10, a calibration logic CLB 20 and a nonvolatile memory STR 30.

The reference temperature measurement circuit 10 may include a temperature detector (DET) 11 and an analog-to-digital convertor CNV 12. The temperature detector 11 may output at least one of a voltage signal VPTAT and a current signal IPTAT proportional to the operation temperature To. The analog-to-digital converter 12 may convert the output of the temperature detector 11 to a digital signal to generate a temperature code TCODE of multiple bits.

In some example embodiments, the temperature detector 11 may be implemented with a first PMOS transistor M1 (with current I1) and a second PMOS transistor M2 (with current I2), a feedback amplifier AMP, a resistor R and a first bipolar transistor B1 and a second bipolar transistor B2, which are coupled between a power supply voltage VDD and a ground voltage VSS as represented in FIG. 4. A voltage dVBE across the resistor R may be obtained as Expression 1.

$$dVBE = VBE1 - VBE2$$

$$= VT*Ln(Ic1/Is1) - VT*Ln(n*Ic2/Is2)$$

$$= VT*Ln(n) \hspace{2cm} \text{Expression 1}$$

In Expression 1, Is1 and Is2 denote reverse saturation currents of the first and second bipolar transistors B1, B2, respectively. Id1 and Ic2 denote currents flowing through the first and second bipolar transistors B1, B2, respectively. The symbol n denotes a gain ratio of the bipolar transistors B1, B2, and VT denotes a temperature voltage that is proportional to an absolute temperature of the temperature detector 11. Ln(n) denotes a constant value and thus the voltage dVBE across the resistor R and the current I2 flowing through the resistor R are proportional to the temperature variation. The voltage signal VPTAT and the current signal IPTAT may be generated as an output based on the voltage dVBE and the current I2 proportional to the operational temperature.

The reference temperature measurement circuit 10 may be implemented with various configurations other than the configuration of FIGS. 3 and 4. The reference temperature measurement circuit 10 is integrated in the semiconductor die SD to measure the junction temperature Tj inside the semiconductor die SD. The reference temperature measurement circuit 10 may be referred to as an on-chip temperature sensor.

The calibration logic 20 may provide the present surface temperature Tc of the semiconductor package based on the present code value of the temperature code TCODE indicating the junction temperature Tj and the calibration information CINF. As described above, the calibration information CINF indicates the mapping relationships between the plurality of reference temperatures and the plurality of reference code values. In some example embodiments, the calibration information CINF may be stored in the nonvolatile memory 30 and provided from the nonvolatile memory 30 to the calibration logic 20. In some example embodiments, the calibration information CINF may be stored in an external apparatus such as a test apparatus and provided to the calibration logic 20 from the external apparatus.

Figures 5, 6:
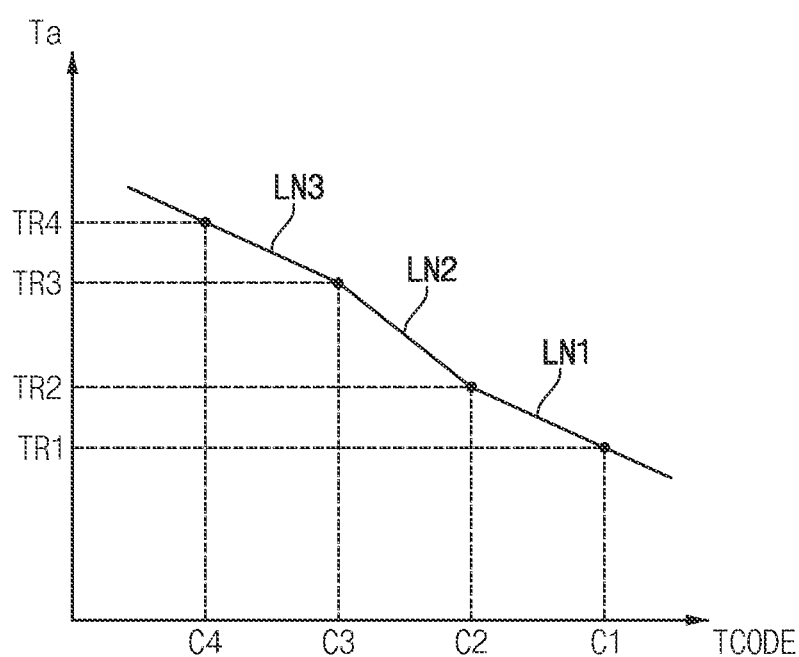
FIGS. 5 and 6 are diagrams illustrating example calibration information and an example embodiment of determining a surface temperature in a method of providing a surface temperature of a semiconductor package according to some example embodiments.

FIGS. 5 and 6 are diagrams illustrating example calibration information and an example embodiment of determining a surface temperature in a method of providing a surface temperature of a semiconductor package according to some example embodiments.

FIG. 5 illustrates the calibration information CINF when the number of the reference temperatures is four. However, this is only an example and, according to example embodiments, the number of the reference temperatures may be determined variously.

Referring to FIG. 5, the calibration information CINF may indicate the mapping relationships between the reference temperatures TR1~TR4 that are set with the air temperature Ta and the reference code values C1~C4 provided through the temperature code TCODE. As illustrated in FIG. 5, a first reference code value C1 may be mapped to a first reference temperature TR1, a second reference code value C2 may be mapped to a second reference temperature TR2, a third reference code value C3 may be mapped to a third reference temperature TR3, and a fourth reference code value C4 may be mapped to a fourth reference temperature TR4.

FIG. 6 illustrates an example embodiment of determining the surface temperature based on the calibration information CINF. FIG. 6 illustrates an example in which the code value of the temperature code TCODE decreases as the air temperature Ta increases. According to the configuration of the above-described reference temperature measurement circuit TMMS, the code value of the temperature code TCODE may increase as the air temperature Ta increases.

Referring to FIG. 6, a conversion function may be determined based on the calibration information CINF, and the present surface temperature may be provided as an output value of the conversion function by inputting a present code value of the temperature code to the conversion function.

In some example embodiments, the conversion function may include at least one linear conversion function. As illustrated in FIGS. 5 and 6, when the calibration information CINF is generated by measuring the four reference code values C1~C4 respectively corresponding to the four reference temperatures TR1~TR4, the conversion function may include three linear conversion functions, that is, a first linear conversion function LN1, a second linear conversion function LN2 and a third linear conversion function LN3.

Each of the first linear conversion function LN1, the second linear conversion function LN2 and the third linear conversion function LN3 may be determined as Expression 2.

$Y = A \cdot X + B$, $A = (TRi - TRk)/(CVi - CVk)$, and $B = (CVk \cdot TRi - CVi \cdot TRk)/(CVk - CVi)$   Expression 2

In Expression 2, TRi and TRk denote two adjacent reference temperatures among the first through fourth reference temperatures TR1~TR4; CVi and CVk denote two reference code values corresponding to Tri and TRk, respectively; X denotes the present code value of the temperature code TCODE, and Y denotes the present surface temperature of the semiconductor package.

As will be described below with reference to FIG. 12, a plurality of measurement time points may be determined based on a soak time such that the surface temperature Tc of the semiconductor package becomes equal to the air temperature Ta after the soak time from when the air temperature Ta is set to each of the plurality of reference temperatures TR1~TR4, and the plurality of reference code values C1~C4 may be measured respectively at the plurality of measurement time points. In this case, the surface temperature Tc of the semiconductor package may be substantially the same as the air temperature Ta. Accordingly the conversion function based on the calibration information CINF may represent the surface temperature Tc of the semiconductor package.

In the example embodiment of FIGS. 5 and 6, the present surface temperature Tc lower than the second reference temperature TR2 may be provided using the first linear conversion function LN1 when the present reference code value is greater than the second reference code value C2. The present surface temperature Tc higher than the third reference temperature TR3 may be provided using the third linear conversion function LN3 when the present reference code value is smaller than the third reference code value C3. The present surface temperature Tc between second reference temperature TR2 and the third reference temperature TR3 may be provided using the second linear conversion function LN2 when the present reference code value is between the second reference code value C2 and the third reference code value C3.

To increase accuracy of the calibration information CINF, it is advantageous to measure the reference code value while the surface temperature Tc of the semiconductor package is maintained equal to the air temperature Ta. In contrast, productivity of the semiconductor package may be degraded if excessive time is consumed to generate the calibration information CINF.

According to example embodiments, as will be described below with reference to FIGS. 7 through 13, the calibration information CINF may be generated and provided during a monitoring burn-in test (MBT) of the semiconductor package. In this case, the above-described air temperature Ta may correspond to a temperature in a test chamber in which the semiconductor package is mounted for the MBT, and the plurality of reference temperatures may be test temperatures for the MBT. Based on the calibration information CINF generated during the MBT, the other tests after the MBT may be controlled based on the calibration information CINF.

Figure 7:
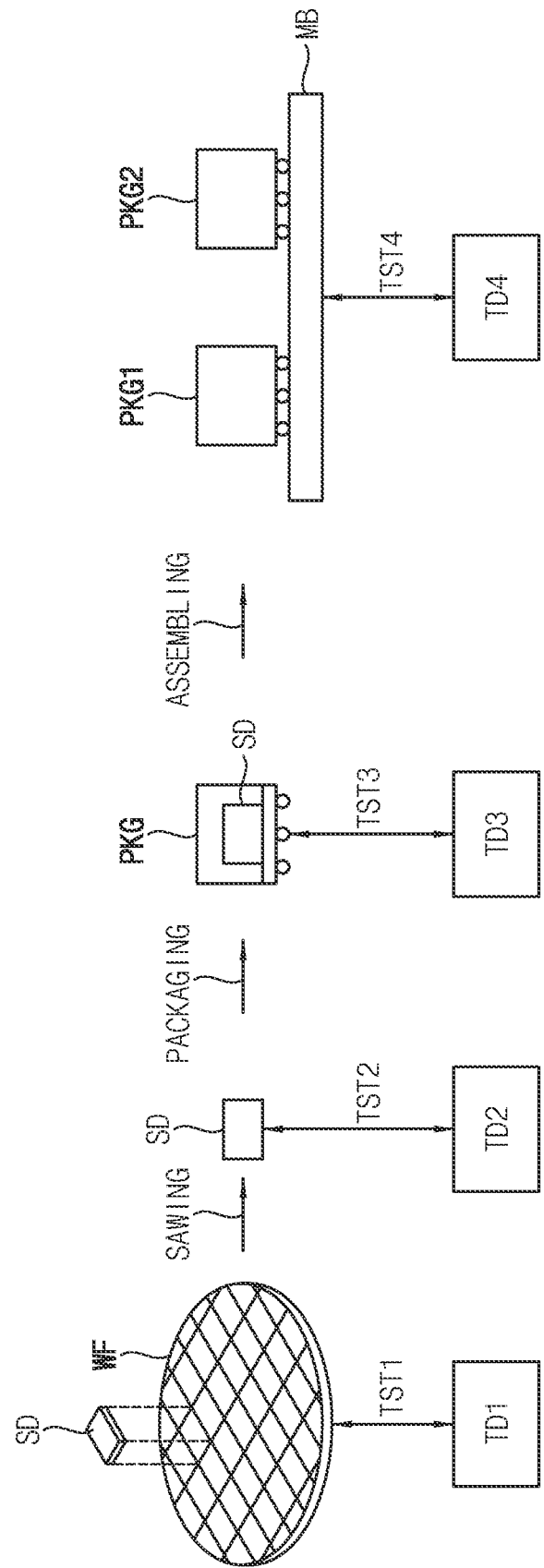
FIGS. 7 and 8 are diagrams for describing tests according to a manufacturing process of a semiconductor device and a system, according to some example embodiments.
Figure 8:
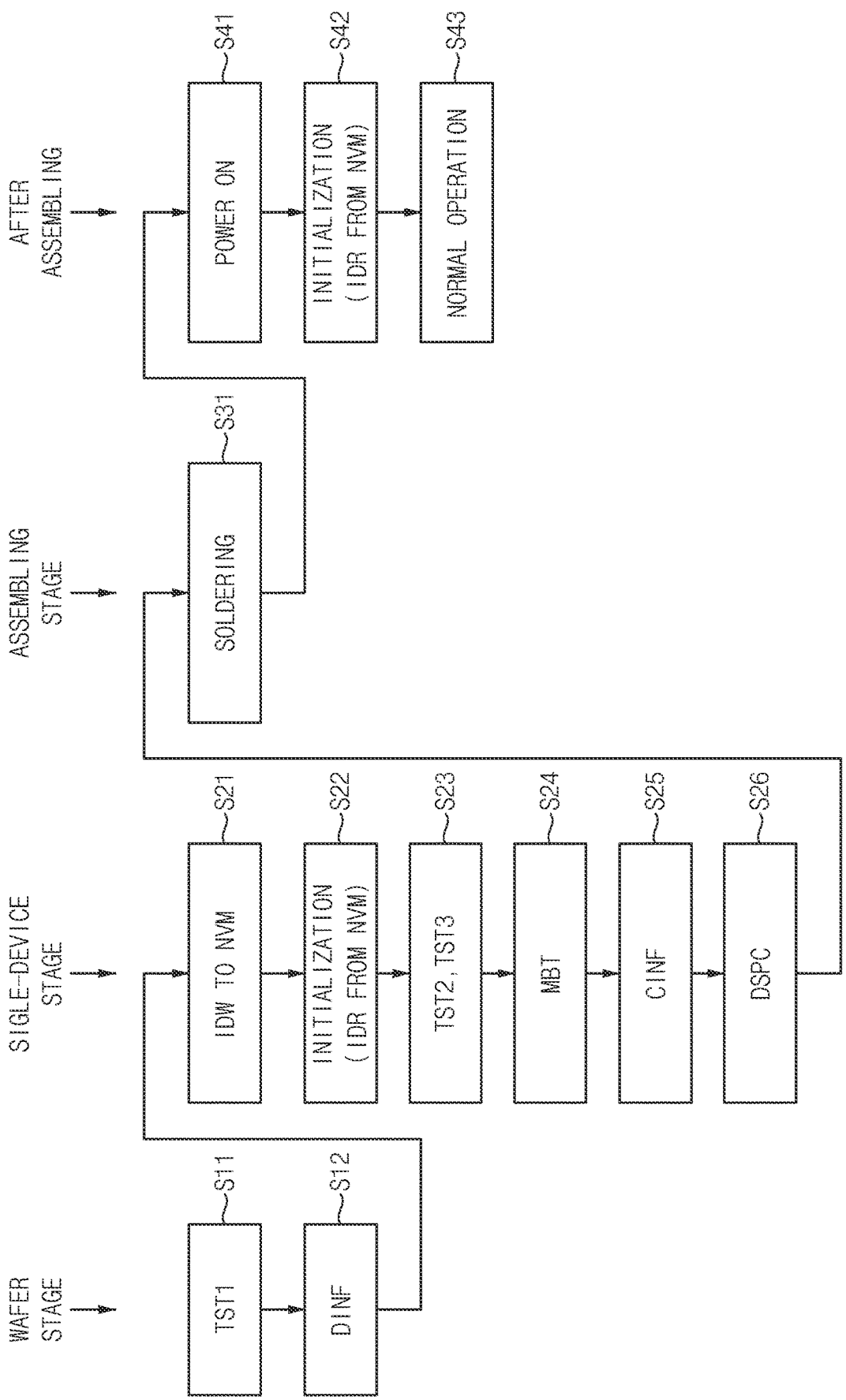

FIGS. 7 and 8 are diagrams for describing tests according to a manufacturing process of a semiconductor device and a system according to some example embodiments.

Referring to FIGS. 7 and 8, a semiconductor wafer WF may include a plurality of semiconductor dies SD in which circuits corresponding to semiconductor devices are integrated. Each semiconductor die SD may correspond to a nonvolatile memory device NVM as will be described with reference to FIGS. 17 through 21.

In a wafer stage before the semiconductor dies SD including the integrated circuits are cut from the wafer WF, a wafer test TST1 for estimating optimization of the semiconductor dies SD on the wafer WF may be performed using a tester device TD1 (S11). Through the wafer test TST1, information on core timing, DC regulators etc. may be obtained and the information data DINF for initialization of the nonvolatile memory device NVM may be provided (S12). As such, the information data DINF may be provided through the wafer test TST1 after the nonvolatile memory device NVM was integrated in the wafer WF and before the nonvolatile memory device NVM is cut from the wafer WF.

After that, each semiconductor die SD is cut from the wafer WF through a sawing process and a packaging process is performed to place the semiconductor die SD in a package PKG.

In a single-device stage, an information data write operation IDW may be performed to store the information data DINF in the nonvolatile memory device NVM (S21), and an information data read operation IDR may be performed to read the information data DINF from the nonvolatile memory device NVM to initialize the nonvolatile memory device NVM in the state of the single device (S22). After the nonvolatile memory device NVM is initialized, single-device tests TST2 and TST3 of the nonvolatile memory device NVM may be performed using tester devices TD2 and TD3 (S23), and special data DSPC for the operation of the first nonvolatile memory device NVM1 may be provided based on the single-device tests TST2 and TST3 (S26). The single-device tests may include the pre-package test TST2 and the post-package test TST3. For example, the special data DSPC may include bad block information of the nonvolatile memory device NVM.

The monitoring burn-in test (MBT) may be performed (S24), and the above-described calibration information CINF may be generated using the MBT (S25). The generation of the calibration information CINF using the MBT will be further described with reference to FIGS. 11 and 12.

The semiconductor packages may be classified into normal (non-defective) products and defective products through various tests to ensure the reliability of the semiconductor packages. Among the various tests, the MBT is conducted under conditions in which a thermal stress of a high temperature ranging from about 80 to about 125 degrees centigrade is applied to a semiconductor package. At this point, the semiconductor package operates at a high temperature under the state where a high electric field is applied thereto. During the MBT, short-lifespan packages do not withstand the test conditions, and defects are noted. Since semiconductor packages passing the MBT, i.e., normal semiconductor packages, indicate a long lifespan, reliability of the system using the normal semiconductor packages may be enhanced.

In an assembling stage, the first semiconductor package PKG1 and the second semiconductor package PKG2 that are packaged may be mounted on a mother board MB through, for example, a soldering process (S31) to assemble a system.

After assembling the memory system, a system test TST4 may be performed using a tester device TD4. When the memory system is powered on (S41), an information data read operation IDR may be performed to read the information data DNF from the nonvolatile memory device NVM and initialize the nonvolatile memory device NVM in the assembled state (S42). After the first nonvolatile memory device NVM1 is initialized, a normal operation of the nonvolatile memory device NVM may be performed (S43).

Hereinafter, an example monitoring burn-in test (MTB) device is described with reference to FIGS. 9 through 10C, but example embodiments are not limited thereto. The calibration information CINF may be generated using various MTB devices.

Figure 9:
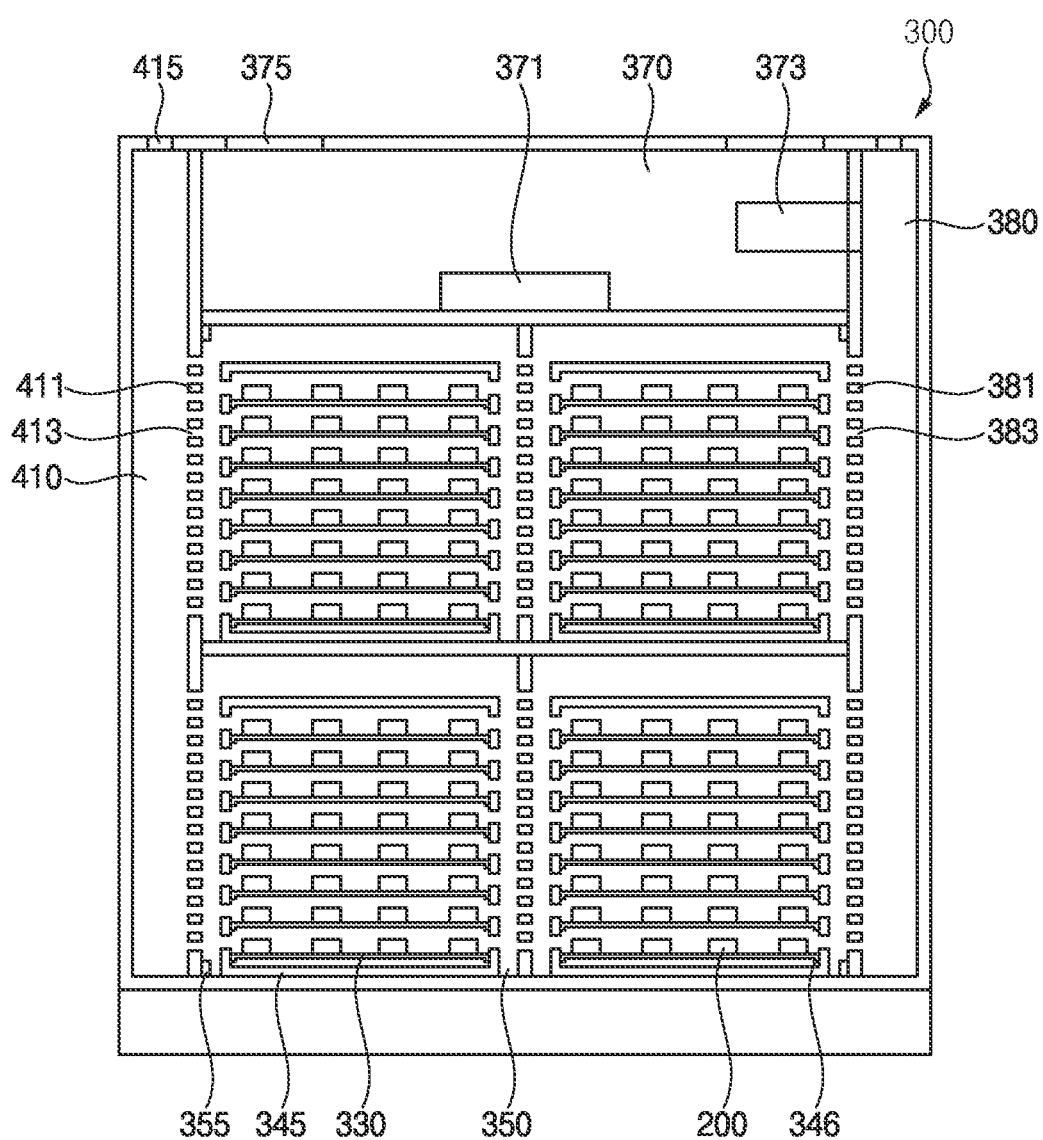
FIG. 9 is a cross-sectional diagram illustrating an example structure of a monitoring burn-in test (MBT) apparatus, according to some example embodiments.

FIG. 9 is a cross-sectional diagram illustrating an example structure of a monitoring burn-in test (MBT) apparatus, according to some embodiments.

Referring to FIG. 9, a burn-in test apparatus 300 is a monitoring burn-in test apparatus configured to perform a burn-in test for a semiconductor package. The burn-in test apparatus 300 adjusts a test temperature condition using heated air.

The burn-in test apparatus 300 includes a burn-in chamber 350 sealed from the outside, a heating part 370 heating air to adjust test conditions, an air supply duct 380 to supply heated air into the burn-in chamber 350, and an exhaust duct 410 to exhaust the air of the burn-in chamber 350 to the outside.

A test for the semiconductor package is performed under the state where the semiconductor package is loaded inside the burn-in chamber 350. A temperature sensor 355 is installed inside the burn-in chamber 350 to measure an internal temperature. One or more semiconductor packages are mounted on one or more test sockets 200, and a plurality of test sockets 200 are each installed at a burn-in board 330. A plurality of burn-in boards 330 are installed inside the burn-in chamber 350 where they are subjected to a test. The burn-in board 330 is installed at a rack 345 where a guide rail 346 is provided. A plurality of racks 345 are installed inside the burn-in chamber 350. For example, four racks 345 are inside the burn-in chamber 350.

The heating part 370 is disposed over the burn-in chamber 350 and is configured to generate heated air supplied into the burn-in chamber 350. The heating part 370 includes a heater 371 to heat air and a fan 373 to forcibly blow heated air to an air supply duct 380.

The air supply duct 380 provides a flow path along which the heated air is supplied into the burn-in chamber 350 from the heating part 370. The exhaust duct 410 provides a flow path along which air is exhausted to the outside from the burn-in chamber 350. In some example embodiments, the air supply duct 380 and the exhaust duct 410 are installed at opposite sides of the burn-in chamber 350, respectively. The air supply duct 380 is installed adjacent to the burn-in chamber 350 and receives air from the heating part 370. The exhaust duct 410 is installed adjacent to the burn-in chamber 350 and exhausts air from the burn-in chamber 350. The air supply duct 380 and the burn-in chamber 350 are separated by a deflection plate 381, and the exhaust duct 410 and the burn-in chamber 350 are separated by a deflection plate 411. The deflection plates 381 and 411 have holes 383 and 413 formed in a certain direction, respectively. The air is supplied and exhausted through the holes 381 and 411.

Controlling a temperature of the burn-in chamber 350 will now be described in detail. An internal temperature of the burn-in chamber 350 is raised until the internal temperature reaches a preset temperature. The air flowing in through an inlet port 375 is heated by the heater 371 and supplied to the air supply duct 380 by the fan 373. The air supplied to the air supply duct 380 is supplied into the burn-in chamber through the deflection plate 381. If a temperature measured by the temperature sensor 355 reaches the preset temperature, an operation of the heater 371 is paused and the fan 373 continues to operate. If the internal temperature of the burn-in chamber 350 increases over the preset temperature due to the heat generated by the operation of the semiconductor package 10, the air inside the burn-in chamber 350 is exhausted to the outside of the burn-in chamber 350 through the exhaust duct 410 and an exhaust port 415. On the other hand, if the internal temperature of the burn-in chamber 350 decreases below the preset temperature, the heater 371 re-operates to heat air supplied into the burn-in chamber 350. These steps are repeated to allow the internal temperature of the burn-chamber to be maintained at the preset temperature. Under this state, an electrical test is conducted by means of a system part (not shown).

In the initial stage of heating or cooling, a temperature difference may be caused between the air injected through the holes 383 corresponding to inlets and the air emitted through the holes 413 corresponding to outlets. The temperature difference may be substantially removed after a soak time is elapsed. In addition, after the soak time, the surface temperature of the mounted semiconductor packages may become substantially equal to the air temperature inside the burn-in chamber 350.

Figure 10A:
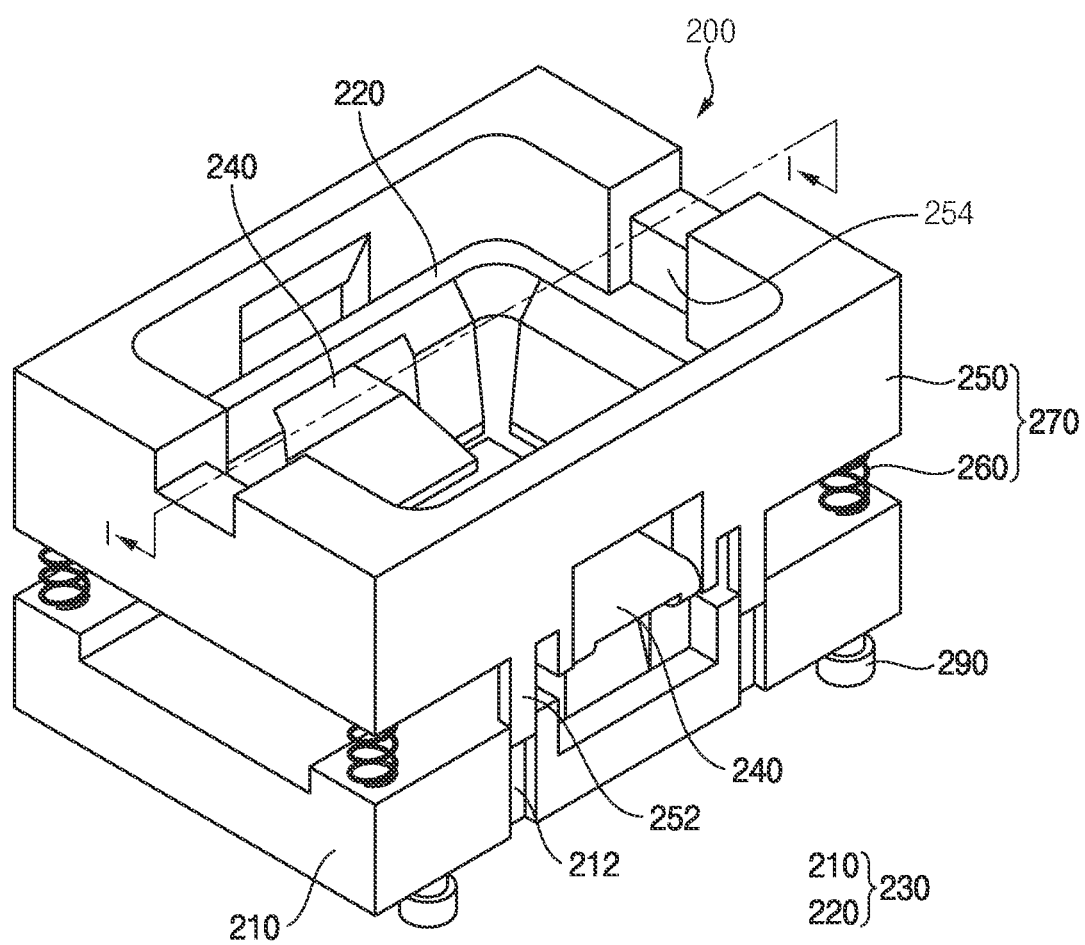
FIGS. 10A, 10B and 10C are diagrams illustrating an example of a socket used in a monitoring burn-in test.
Figure 10B:
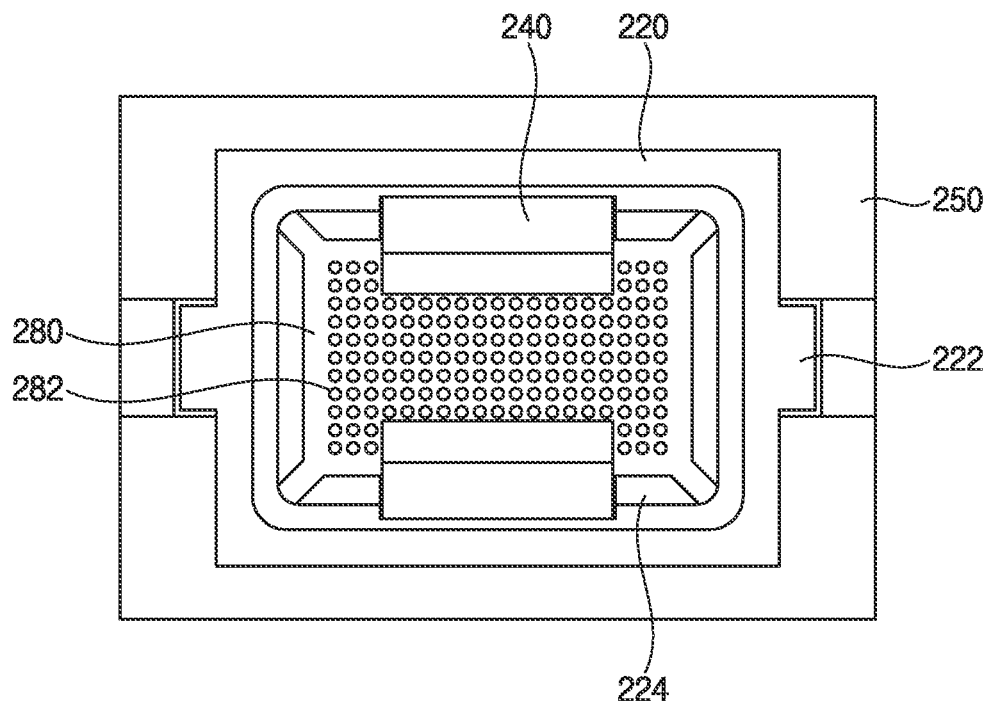
Figure 10C:
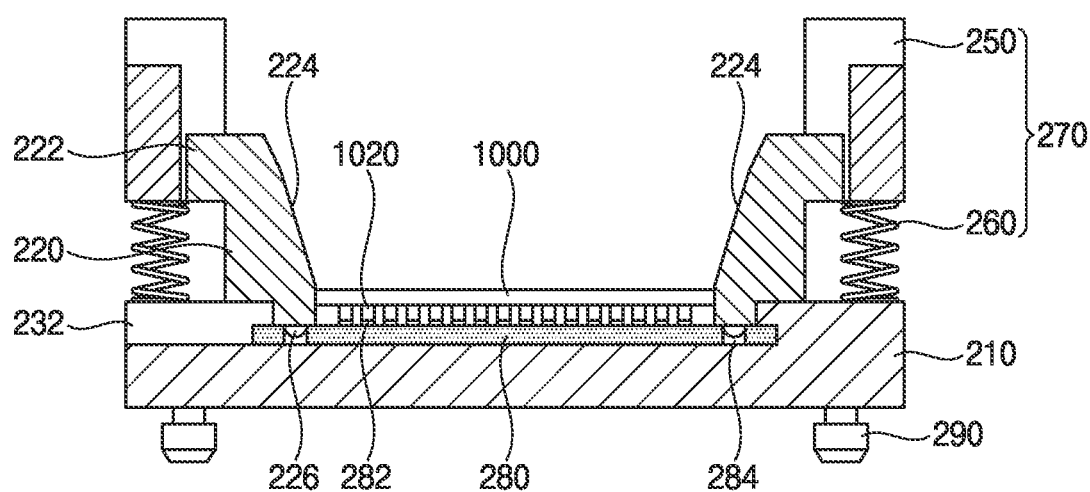

FIGS. 10A, 10B and 10C are diagrams illustrating an example of a socket used in a monitoring burn-in test, according to some example embodiments. FIG. 10A is a perspective view of a test socket 200 in FIG. 9, FIG. 10B is a top plan view of the test socket 200, and FIG. 10c is a cross-sectional view taken along the line I-I' in FIG. 10B.

A plurality of test sockets 200 are each installed at a burn-in board 330. A semiconductor package 1000 is mounted on a test socket 200. Under this state, a test is conducted for the semiconductor package 1000.

The test socket 200 includes a base 230 and a contact sheet 280 fixed to the base 230. The base 230 includes a body 210 and an adaptor 220 and accommodates the semiconductor package 1000. A support 290 is coupled to the bottom of the body 210. The body 210 is fixed to a burn-in board 330 by means of the support 290. As illustrated in FIG. a plurality of guide grooves 212 are formed at both side portions of the body 210 and serve to guide the movement of guide bars 252, which will be described below, respectively.

Referring to FIGS. 10B and 10C, the adaptor 220 has the shape of a quadrangular ring and is coupled with the top of the body 210. A guide rail 222 is provided at sides of an outer wall of the adaptor 220 and migrates along a guide groove 254 provided at a cover 250.

An inclined surface 224 is formed at the inner wall of the adaptor 220. The inclined surface 224 protrudes downwardly toward the center of the adaptor 220. The inclined surface 224 is formed at respective four sides, guiding the semiconductor package 1000 to be loaded at a desired position on the base 230. The edge of the semiconductor package 1000 loaded at the desired position on the base 230 is in contact with the bottom ends of the inclined surfaces 224. When a size of the semiconductor package 1000 varies, the adaptor 220 is changed.

A plurality of stoppers 226 are provided at the bottom surface of the adaptor 220 disposed on an insert slot 232. A stopper 226 serves to fix a contact sheet 280 installed on the insert slot 232. A plurality of fix holes 284 are formed on the contact sheet 280. When the contact sheet 280 is inserted on the insert slot 232, the stoppers 226 are inserted into the fix holes 284, respectively. Thus, the contact sheet 280 may be fixed on the insert slot 232.

The contact sheet 280 is made of the same material as a flexible circuit board, and a plurality of contact terminals 282 are formed on the contact sheet 280. The semiconductor package 1000 to be tested is loaded on the contact sheet 280, and the contact terminals 282 are in contact with terminals 1020 formed at the semiconductor package 1000. Thus, the semiconductor package 1000 is electrically connected to the contact sheet 280. The contact sheet 280 may change whenever there is variation in size or terminal-to-terminal distance (e.g., ball pitch) of a semiconductor package 1000 to be tested. The semiconductor package 1000 and the contact sheet 280 are electrically connected by contacting the contact terminals 282 with the terminals 1020. For this reason, if a distance between the terminals 1020 changes, a distance between the contact terminals 282 must also change. While the contact sheet 280 is made of the same material as a flexible circuit board, example embodiments are not limited to that material. In some example embodiments, the contact sheet 280 can include a printed circuit board (PCB).

The test socket 200 further includes a latch 240 and a latch driving member 270. The latch 240 fixes a position of the semiconductor package 1000 in the base 230, and the latch driving member 270 drives the latch 240.

The latch driving member 270 includes a cover 250 and a spring 260. The cover 250 has the shape of a quadrangular ring to surround the adapter 220. Guide bars 252 are provided at sides of the cover 250 and move along guide grooves 212, respectively. The spring 260 is installed between the cover 250 and the body 210 and provides an elastic force upwardly against the cover 250.

The test socket 200 may have an open-top structure such that the upper surface of the mounted semiconductor package may be exposed to the air in the burn-in chamber 350 as described with reference to FIGS. 10A, 10B and 10C. Using the test socket 200 having the open-top structure, the soak time, after which the surface temperature Tc of the semiconductor package becomes equal to the air temperature Ta, may be reduced.

Figure 12:
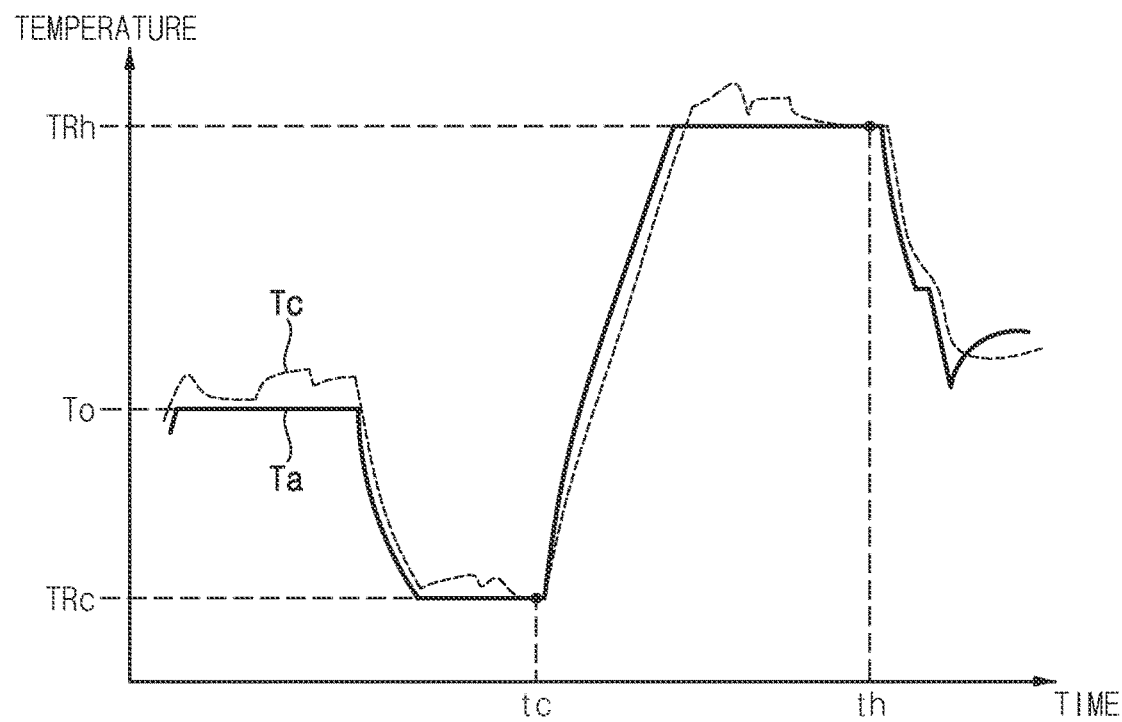
FIG. 12 is a diagram for describing a procedure of a monitoring burn-in test to which the method of FIG. 11 is applied, according to some example embodiments.
Figure 13:
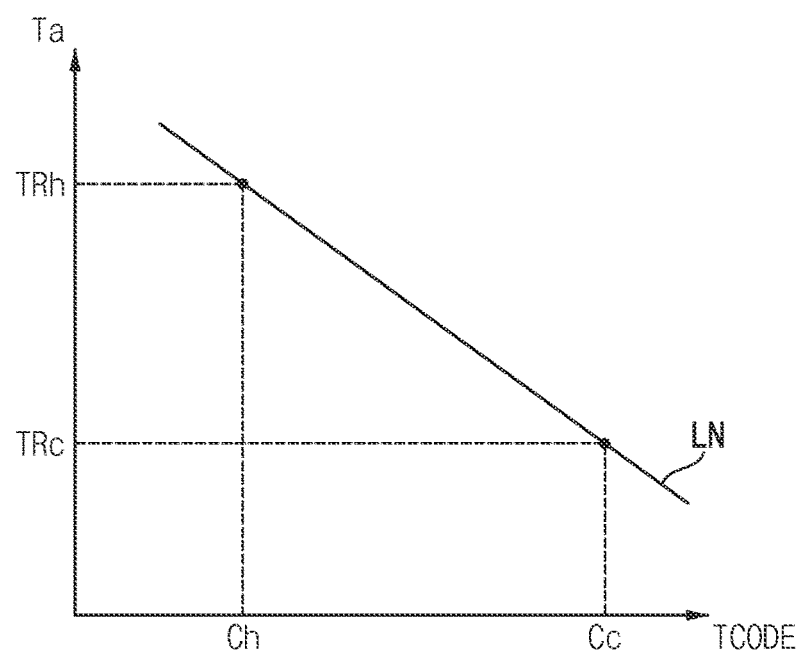
FIG. 13 is a diagram illustrating an example embodiment of determining a surface temperature in the method of FIG. 11, according to some example embodiments.

FIG. 11 is a flowchart illustrating a method of providing a surface temperature of a semiconductor package according to some example embodiments, and FIG. 12 is a diagram for describing a procedure of a monitoring burn-in test to which the method of FIG. 11 is applied, according to some example embodiments. FIG. 13 is a diagram illustrating an example embodiment of determining a surface temperature in the method of FIG. 11.

Referring to FIGS. 11, 12 and 13, an air temperature Ta in a test chamber in which a semiconductor package is mounted for a burn-in test may be set to a first reference temperature TRc (S110). For example, the first reference temperature TRc may be about −10 degrees centigrade.

A first reference code value Cc corresponding to the first reference temperature TRc may be measured based on a temperature code TCODE indicating a junction temperature Tj in a semiconductor die in the semiconductor package while the air temperature is set to the first reference temperature TRc (S210). As described above, in some example embodiments, the temperature code TCODE may be provided from the reference temperature measurement circuit integrated in the semiconductor die.

The air temperature Ta in the test chamber may be set to a second reference temperature TRh (S120). For example, the second reference temperature TRh may be about 85 degrees centigrade.

A second reference code value CCh corresponding to the second reference temperature TRh may be measured based on the temperature code TCODE while the air temperature Ta is set to the second reference temperature TRh (S220).

FIG. 12 illustrates the change of the air temperature Ta and the surface temperature Tc over time, where the air temperature Ta is measured inside the test chamber and the surface temperature Tc is measured using an additional temperature sensor attached to the surface of the semiconductor package. The air temperature Ta may be changed from the initial temperature To to the first reference temperature TRc and then to the second reference temperature TRh.

As illustrated in FIG. 12, after the soak time, the surface temperature Tc may become substantially equal to the air temperature Ta. As such, a plurality of measurement time points tc and th may be determined based on the soak time such that the surface temperature Tc of the semiconductor package becomes equal to the air temperature Ta after the soak time from when the air temperature is set to each of the first reference temperature TRc and the second reference temperature TRh. The first reference code value Cc and the second reference code value Ch may be measured respectively at the time points tc and th.

It takes too much time and cost to attach a temperature sensor to each surface of all semiconductor packages that are tested in parallel. According to example embodiments, the first and second reference code values Cc and Ch may be measured independently for each semiconductor package during the MTB after the soak time, and thus the calibration information CINF for each semiconductor package may be generated without excessive increase in cost and test time. The accurate surface temperature Tc for each semiconductor package may be provided based on the respective calibration information CINF.

Returning to FIG. 11, the calibration information indicating a mapping relationship between the first reference temperature TRc and the first reference code value Cc and a mapping relationship between the second reference temperature TRh and the second reference code value Cr may be generated (S310). In some example embodiments, the calibration information CINF may be stored in the nonvolatile memory STR as illustrated in FIGS. 2 and 3.

A linear conversion function may be determined based on the calibration information CINF (S410), and a present surface temperature of the semiconductor package corresponding to an output value of the linear conversion function may be provided by inputting a present code value of the temperature code TCODE to the linear conversion function (S420).

Referring to FIG. 13, a linear conversion function LN may be determined based on the calibration information CINF indicating mapping relationships between the first and second reference temperatures TRc and TRh and the first and second reference code values Cc and Ch. The present surface temperature corresponding to the output of the linear conversion function LN may be provided by inputting the present reference code value of the temperature code TCODE to the linear conversion function LN. The linear conversion function LN may be represented by Expression 3.

$$Y=A \cdot X+B,$$

$$A=(TRh-TRc)/(CVh-CVc), \text{ and}$$

$$B=(CVc \cdot TRh-CVh \cdot TRc)/(CVc-CVh), \quad \text{Expression 3}$$

In Expression 3, TRh and TRc denote the first reference temperature and the second reference temperature respectively, CVh and CVc denote the first reference code value and the second reference code value respectively, X denotes the present code value of the temperature code, and Y denotes the present surface temperature of the semiconductor package.

Figure 14A:
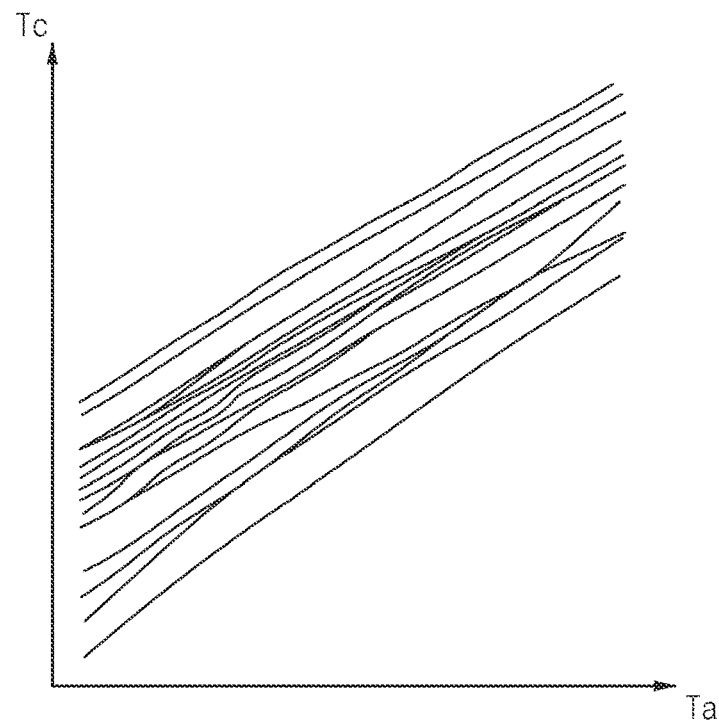
FIGS. 14A and 14B are diagrams illustrating effects of a method of providing a surface temperature of a semiconductor package according to some example embodiments.
Figure 14B:
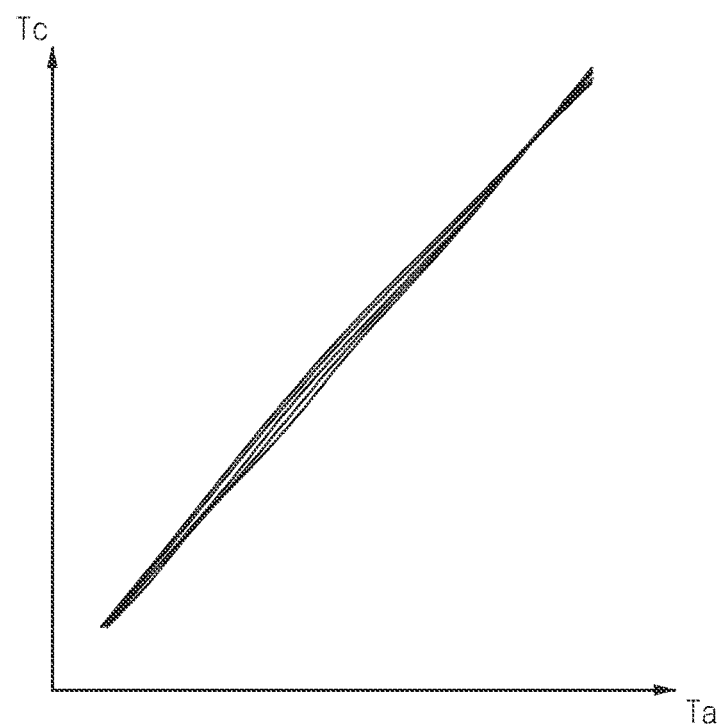

FIGS. 14A and 14B are diagrams illustrating effects of a method of providing a surface temperature of a semiconductor package according to some example embodiments.

In FIGS. 14A and 14B, the horizontal axis indicates the air temperature Ta and the vertical axis indicates the surface temperature Tc of the semiconductor package. FIG. 14A illustrates the surface temperature Tc of a plurality of semiconductor packages, which are determined using a related art scheme, and FIG. 14B illustrates the surface temperature Tc of the plurality of semiconductor packages, which are determined using the method according to some example embodiments.

As illustrated in FIG. 14A, the plurality of semiconductor packages may provide the different junction temperatures depending on the respective operational characteristics. If a fixed calibration is applied to the different junction temperatures, the surface temperatures of the plurality of semiconductor packages may be determined to be largely different from each other even though the air temperature and the real surface temperatures are substantially equal to each other. The test error may be increased due to the inaccurate surface temperature Tc.

In contrast, as illustrated in FIG. 14B, the uniform surface temperature Tc may be provided by generating the calibration information CNF for each semiconductor package according to example embodiments.

Figure 15:
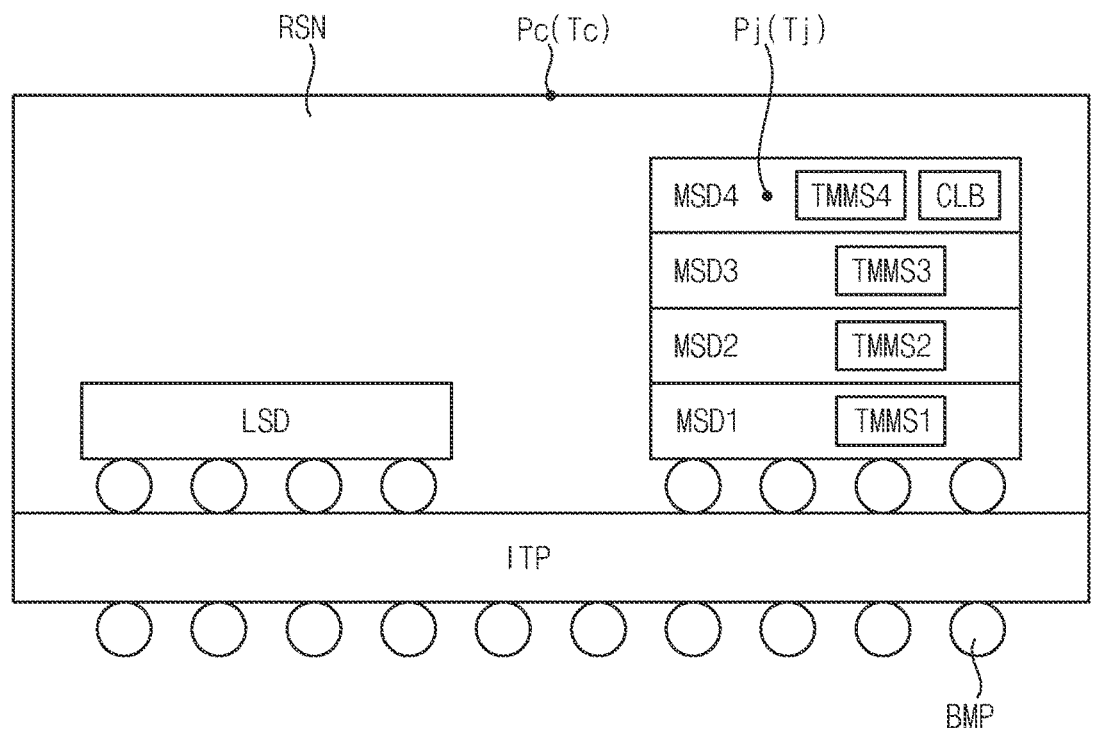
FIGS. 15 and 16 are diagrams illustrating a semiconductor package according to some example embodiments.
Figure 16:
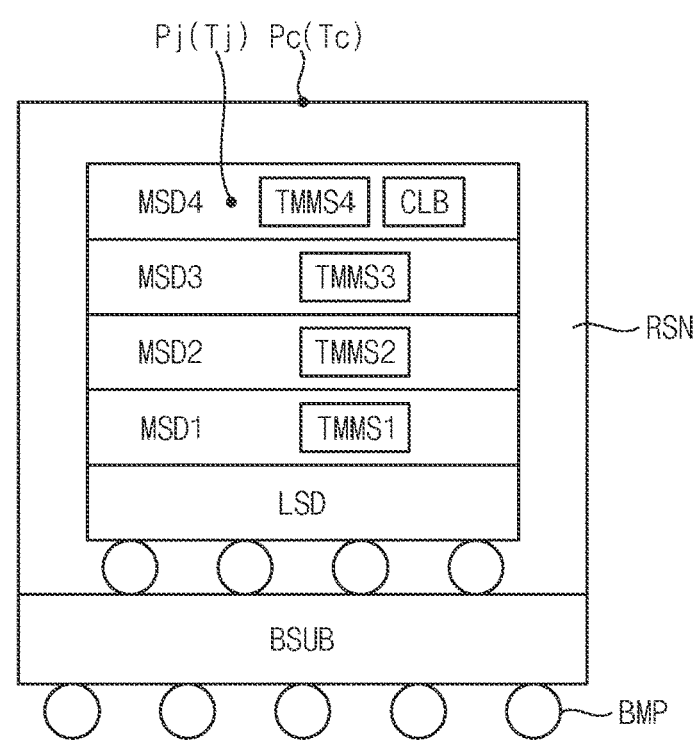

FIGS. 15 and 16 are diagrams illustrating a semiconductor package according to some example embodiments.

Referring to FIG. 15, a semiconductor package 1000a may be a memory package, and may include a base substrate or an interposer ITP and a stacked memory device stacked on the interposer ITP. The stacked memory device may include a logic semiconductor die LSD (or a buffer semiconductor die) and a plurality of memory semiconductor dies MSD1, MSD2, . . . , MSD4.

Referring to FIG. 16, a semiconductor package 1000b may be a memory package and may include a base substrate BSUB and a stacked memory device stacked on the base substrate BSUB. The stacked memory device may include a logic semiconductor die LSD and a plurality of memory semiconductor dies MSD1~MSD4.

FIG. 15 illustrates a structure in which the memory semiconductor dies MSD1~MSD4 except for the logic semiconductor die LSD are stacked vertically and the logic semiconductor die LSD is electrically connected to the memory semiconductor dies MSD1~MSD4 through the interposer ITP or the base substrate. In contrast, FIG. 16 illustrates a structure in which the logic semiconductor die LSD is stacked vertically with the memory semiconductor dies MSD1~MSD4.

The base substrate BSUB may be the same as the interposer ITP or include the interposer ITP. The base substrate BSUB may be a printed circuit board (PCB). External connecting elements such as conductive bumps BMP may be formed on a lower surface of the base substrate BSUB and internal connecting elements such as conductive bumps may be formed on an upper surface of the base substrate BSUB.

In some example embodiments, the semiconductor dies LSD and MSD1~MSD4 may be electrically connected through through-silicon vias. In other example embodiments, the semiconductor dies LSD and MSD1~MSD4 may be electrically connected through the bonding wires. In still other example embodiments, the semiconductor dies LSD and MSD1~MSD4 may be electrically connected through a combination of the through-silicon vias and the bonding wires. In the example embodiment of FIG. 15, the logic semiconductor die LSD may be electrically connected to the memory semiconductor dies MSD1~MSD4 through conductive line patterns formed in the interposer ITP. The stacked semiconductor dies LSD and MSD1~MSD4 may be packaged using an encapsulant such as resin RSN.

Temperature measurement circuits TMMS1~TMMS4 as described above may be disposed in each of the memory semiconductor dies MSD1~MSD4. The temperature measurement circuits TMMS1~TMMS4 may generate the temperature codes by measuring the junction temperatures or the operation temperatures of the memory semiconductor dies MSD1~MSD4, respectively.

The reference temperature measurement circuit as described above may be the temperature measurement circuit TMMS4 that is integrated in the uppermost memory semiconductor die MSD4 among the stacked memory semiconductor dies MSD1~MSD4. The calibration logic CLB may be integrated in the same memory semiconductor die MSD4 as the reference temperature measurement circuit TMMS4. As such, the further accurate surface temperature Tc may be provided by reducing the surface location Pc corresponding to the surface temperature Tc and the junction location Tj corresponding to the junction temperature Tj.

In general, the logic semiconductor die LSD emits a relatively large amount of heat. Some semiconductor packages may have a bypass function such that the memory semiconductor dies MSD1~MSD4 may operate independently even though the logic semiconductor die LSD is disabled. In this case, the reference temperature measurement circuit TMMS4 may measure the reference code values as described above, while the bypass function is activated, that is, while the logic semiconductor die LSD is disabled. As such, the further accurate surface temperature Tc may be provided by minimizing the heal generated in the semiconductor package during the measurement of the reference code values.

Figure 17:
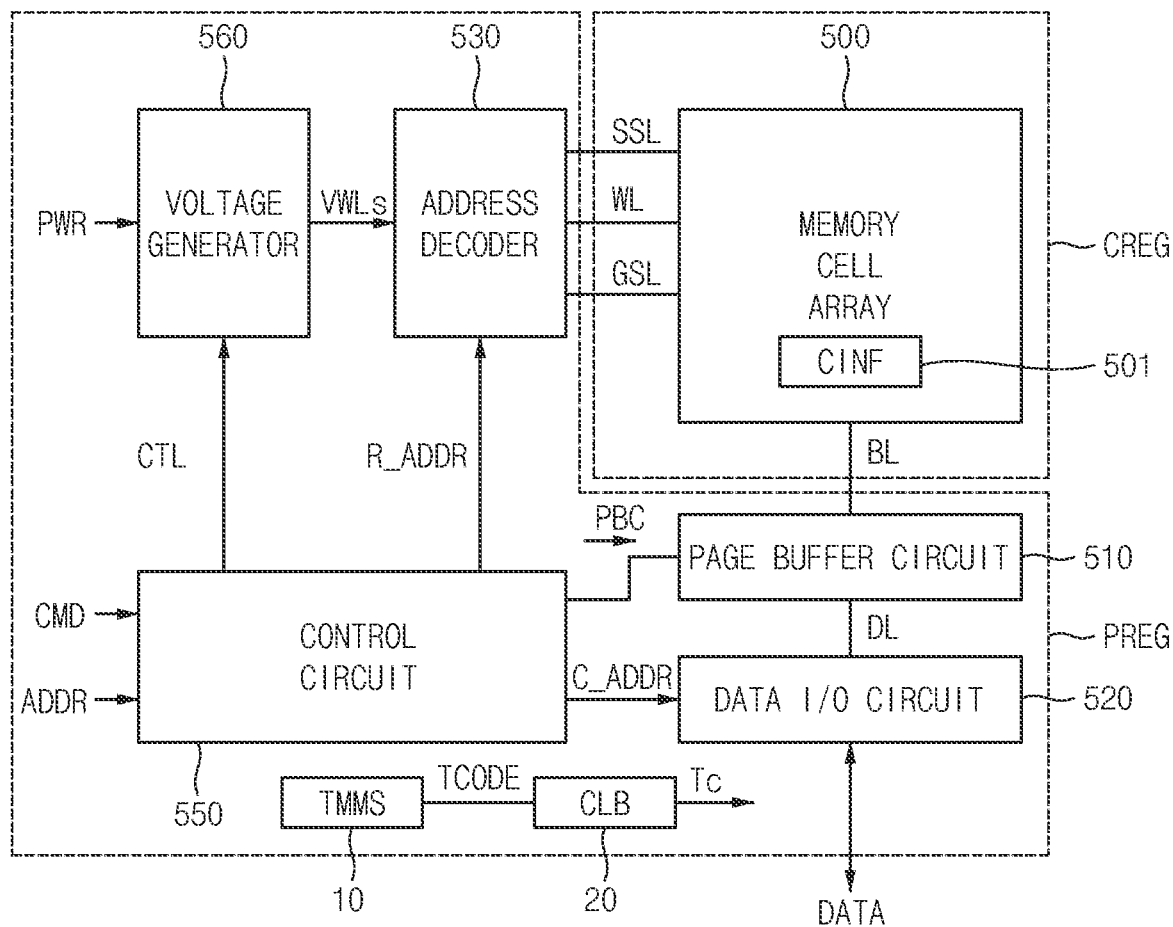
FIG. 17 is a block diagram illustrating a nonvolatile memory device according to some example embodiments.

FIG. 17 is a block diagram illustrating a nonvolatile memory device according to some example embodiments.

Referring to FIG. 17, a nonvolatile memory device 1500 may include a memory cell array 500, a page buffer circuit 510, a data input/output (I/O) circuit 520, an address decoder 530, a control circuit 550, a voltage generator 560, a reference temperature measurement circuit TMMS 10 and a calibration logic CLB 20. The memory cell array 500 may be disposed in a cell region CREG in FIG. 20, and the page buffer circuit 510, the data I/O circuit 520, the address decoder 530, the control circuit 550 and the voltage generator 560 may be disposed in a peripheral region PREG in FIG. 20.

The memory cell array 500 may be coupled to the address decoder 530 through string selection lines SSL, wordlines WL, and ground selection lines GSL. In addition, the memory cell array 500 may be coupled to the page buffer circuit 510 through a bitlines BL. The memory cell array 500 may include a memory cells coupled to the wordlines WL and the bitlines BL. In some example embodiments, the above-described calibration information CNF 501 may be stored in a portion of the memory cell array 500.

In some example embodiments, the memory cell array 500 may be a three-dimensional memory cell array, which is formed on a substrate in a three-dimensional structure (for example, a vertical structure). In this case, the memory cell array 500 may include cell strings (e.g., NAND strings) that are vertically oriented such that at least one memory cell is overlapped vertically with another memory cell.

The control circuit 550 may receive a command (signal) CMD and an address (signal) ADDR from a memory controller. Accordingly, the control circuit 550 may control erase, program and read operations of the nonvolatile memory device 1500 in response to (or based on) at least one of the command signal CMD and the address signal ADDR. An erase operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 550 may generate the control signals CTL used to control the operation of the voltage generator 560, and may generate the page buffer control signal PBC for controlling the page buffer circuit 510 based on the command signal CMD, and generate the row address R_ADDR and the column address C_ADDR based on the address signal ADDR. The control circuit 550 may provide the row address R_ADDR to the address decoder 530 and provide the column address C_ADDR to the data I/O circuit 520.

The address decoder 530 may be coupled to the memory cell array 500 through the string selection lines SSL, the wordlines WL, and the ground selection lines GSL. During the program operation or the read operation, the address decoder 530 may determine or select one of the wordlines WL as a selected wordline and determine the remaining wordlines WL except for the selected wordline as unselected wordlines based on the row address R_ADDR.

During the program operation or the read operation, the address decoder 530 may determine one of the string selection lines SSL as a selected string selection line and determine rest of the string selection lines SSL except for the selected string selection line as unselected string selection lines based on the row address R_ADDR.

The voltage generator 560 may generate wordline voltages VWL, which are required for the operation of the memory cell array 500 of the nonvolatile memory device 1500, based on the control signals CTL. The voltage generator 560 may receive power PWR from the memory controller. The wordline voltages VWL may be applied to the wordlines WL through the address decoder 530.

For example, during the erase operation, the voltage generator 560 may apply an erase voltage to a well and/or a common source line of a memory block and apply an erase permission voltage (e.g., a ground voltage) to all or a portion of the wordlines of the memory block based on an erase address. During the erase verification operation, the voltage generator 560 may apply an erase verification voltage simultaneously to all of the wordlines of the memory block or sequentially (e.g., one by one) to the wordlines.

For example, during the program operation, the voltage generator 560 may apply a program voltage to the selected wordline and may apply a program pass voltage to the unselected wordlines. In addition, during the program verification operation, the voltage generator 560 may apply a program verification voltage to the first wordline and may apply a verification pass voltage to the unselected wordlines.

During the normal read operation, the voltage generator 560 may apply a read voltage to the selected wordline and may apply a read pass voltage to the unselected wordlines. During the data recover read operation, the voltage generator 560 may apply the read voltage to a wordline adjacent to the selected wordline and may apply a recover read voltage to the selected wordline.

The page buffer circuit 510 may be coupled to the memory cell array 500 through the bitlines BL. The page buffer circuit 510 may include multiple buffers. In some example embodiments, each buffer may be connected to a single bitline. In other example embodiments, each buffer may be connected to two or more bitlines. The page buffer circuit 510 may temporarily store data to be programmed in a selected page or data read out from the selected page of the memory cell array 500.

The data I/O circuit 520 may be coupled to the page buffer circuit 510 through data lines DL. During the program operation, the data I/O circuit 520 may receive program data DATA received from the memory controller and provide the program data DATA to the page buffer circuit 510 based on the column address C_ADDR received from the control circuit 550. During the read operation, the data I/O circuit 520 may provide read data DATA, having been read from the memory cell array 500 and stored in the page buffer circuit 510, to the memory controller based on the column address C_ADDR received from the control circuit 550.

In addition, the page buffer circuit 510 and the data I/O circuit 520 may read data from a first area of the memory cell array 500 and write the read data to a second area of the memory cell array 500 (e.g., without transmitting the data to a source external to the nonvolatile memory device 1500, such as to the memory controller). For example, the page buffer circuit 510 and the data I/O circuit 520 may perform a copy-back operation.

As described above, the reference temperature measurement circuit TMMS 10 may be integrated in the same semiconductor die in which the nonvolatile memory device 1500 is integrated, and generate the temperature code TCODE indicating the junction temperature inside the semiconductor die. The calibration logic CLB 20 may provide the surface temperature Tc of the semiconductor package, in which the nonvolatile memory device 1500 is implemented, based on the calibration information CINF and the present code value of the temperature code TCODE.

Figure 18:
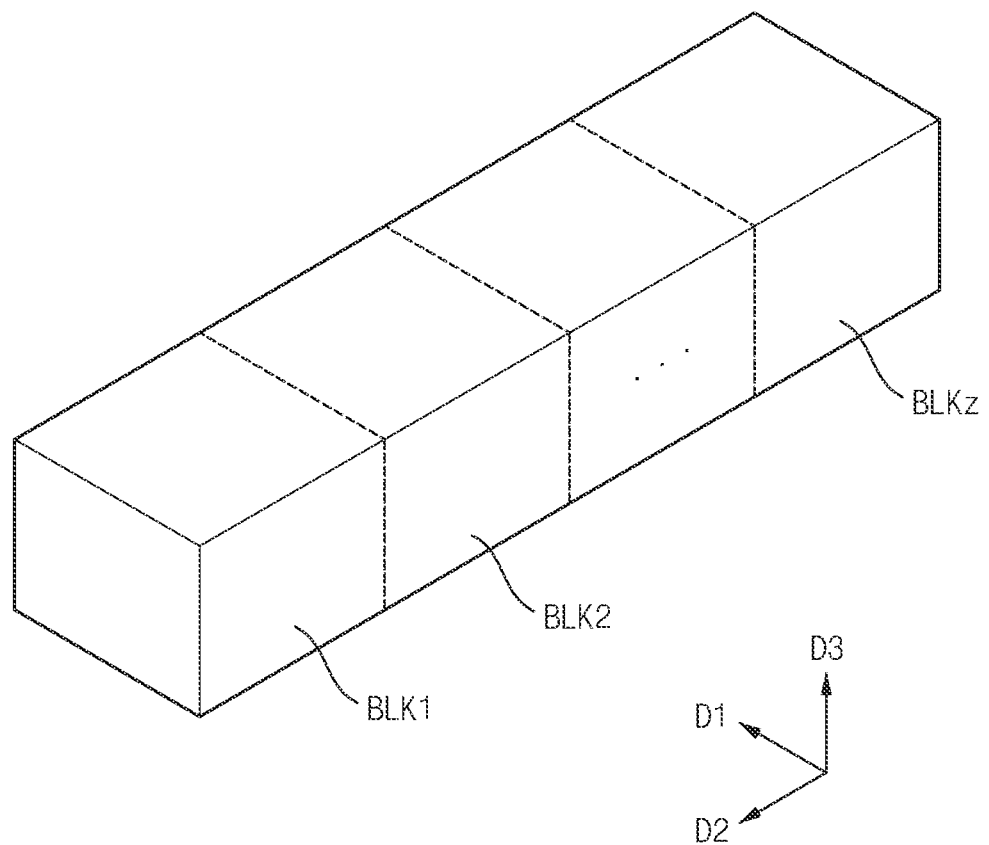
FIG. 18 is a block diagram illustrating a memory cell array included in the nonvolatile memory device of FIG. 17, according to some example embodiments.
Figure 19:
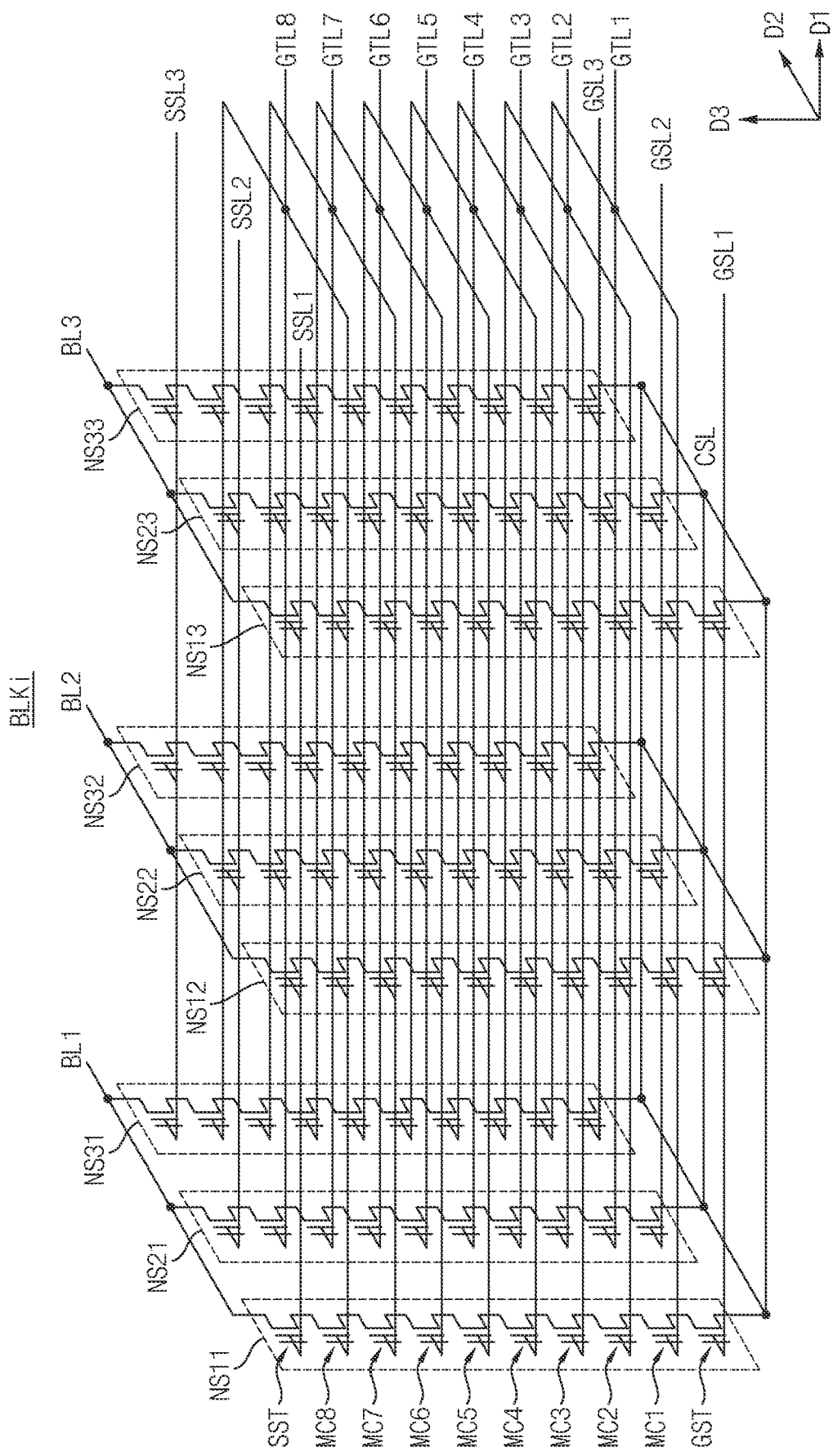
FIG. 19 is a circuit diagram illustrating an equivalent circuit of a memory block included in the memory cell array of FIG. 18, according to some example embodiments.

FIG. 18 is a block diagram illustrating a memory cell array included in the nonvolatile memory device of FIG. 17, and FIG. 19 is a circuit diagram illustrating an equivalent circuit of a memory block included in the memory cell array of FIG. 18.

Referring to FIG. 18, the memory cell array 500 may include memory blocks BLK1 to BLKz. In some example embodiments, the memory blocks BLK1 to BLKz may be selected by the address decoder 430 in FIG. 17. For example, the address decoder 430 may select a particular memory block BLK among the memory blocks BLK1 to BLKz corresponding to a block address.

The memory block BLKi of FIG. 19 may be formed on a substrate in a three-dimensional structure (for example, a vertical structure). For example, NAND strings or cell strings included in the memory block BLKi may be disposed in the vertical direction D3 perpendicular to the upper surface of the substrate.

Referring to FIG. 19, the memory block BLKi may include cell strings or NAND strings NS11 to NS33 coupled between bitlines BL1, BL2 and BL3 and a common source line CSL. Each NAND string may include a plurality of memory cells stacked in the vertical direction D3, and the plurality of wordlines may be stacked in the vertical direction D3.

Each of the NAND strings NS11 to NS33 may include a string selection transistor SST, memory cells MC1 to MC8, and a ground selection transistor GST. In FIG. 19, each of the NAND strings NS11 to NS33 is illustrated to include eight memory cells MC1 to MC8. However, embodiments are not limited thereto. In some embodiments, each of the NAND strings NS11 to NS33 may include any number of memory cells.

Each string selection transistor SST may be connected to a corresponding string selection line (for example, one of SSL1 to SSL3). The memory cells MC1 to MC8 may be connected to corresponding gate lines GTL1 to GTL8, respectively. The gate lines GTL1 to GTL8 may be wordlines, and some of the gate lines GTL1 to GTL8 may be dummy wordlines. Each ground selection transistor GST may be connected to a corresponding ground selection line (for example, one of GSL1 to GSL3). Each string selection transistor SST may be connected to a corresponding bitline (e.g., one of BL1, BL2 and BL3), and each ground selection transistor GST may be connected to the common source line CSL.

The wordline (each of the gate lines GTL1 to GTL8) having the same height may be commonly connected, and the ground selection lines GSL1 to GSL3 and the string selection lines SSL1 to SSL3 may be separated. In FIG. 15, the memory block BLKi is illustrated to be coupled to eight gate lines GTL1 to GTL8 and three bitlines BL1 to BL3. However, example embodiments are not limited thereto. Each memory block in the memory cell array 500 may be coupled to any number of wordlines and any number of bitlines.

Figure 20:
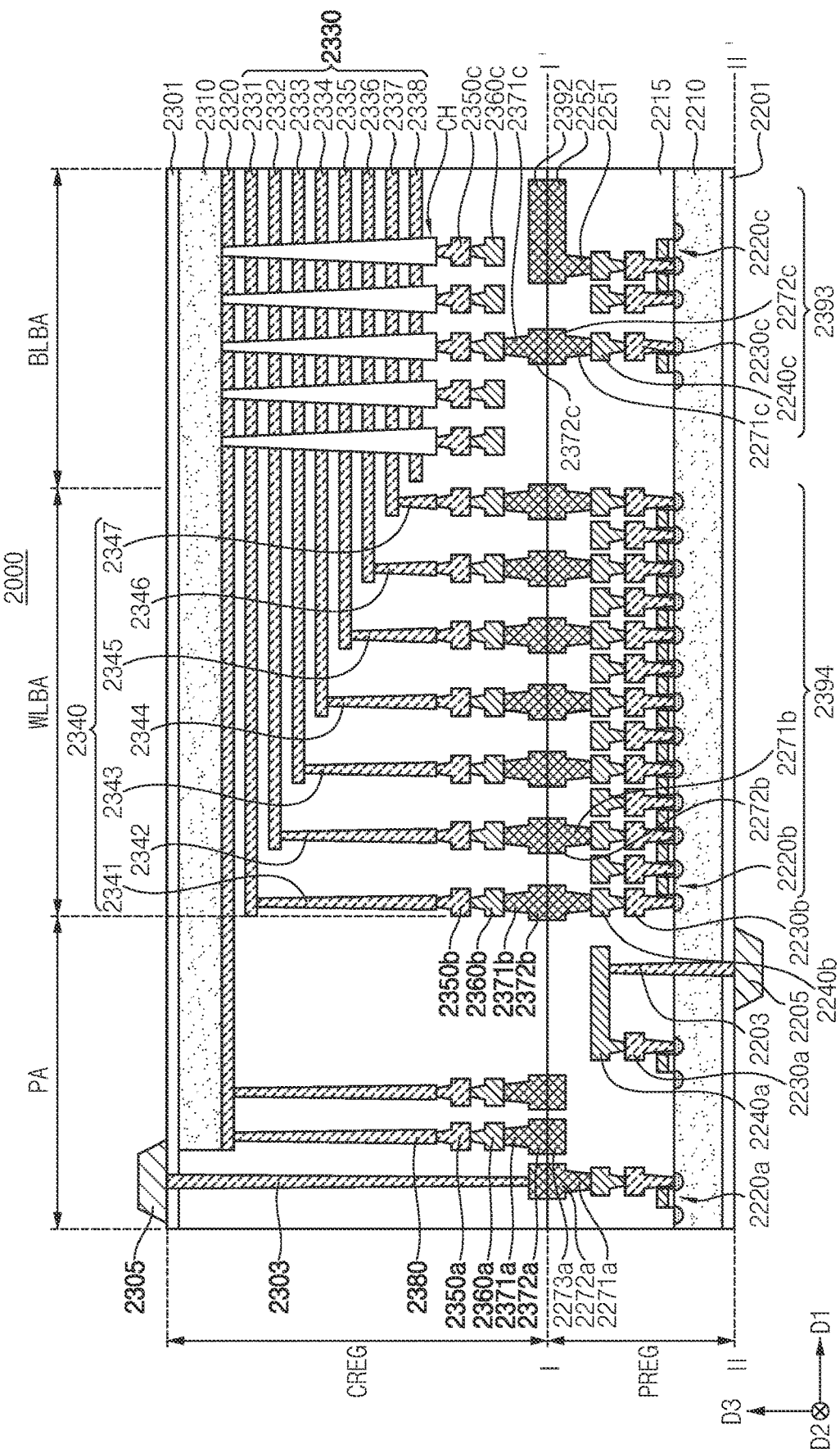
FIG. 20 is a cross-sectional diagram illustrating a nonvolatile memory device according to some example embodiments.

FIG. 20 is a cross-sectional diagram illustrating a nonvolatile memory device according to example embodiments.

Referring to FIG. 20, a nonvolatile memory device 2000 may have a chip-to-chip (C2C) structure. Here, the term "C2C structure" denotes a structure in which an upper chip includes a memory cell region (e.g., the cell region CREG) on a first wafer, and a lower chip includes a peripheral circuit region (e.g., the peripheral region PREG) on a second wafer, in which the upper chip and the lower chip are bonded (or mounted) together at a bonding surface IT. In this regard, the bonding process may include a method of electrically connecting a bonding metal formed on an uppermost metal layer of the upper chip and a bonding metal formed on an uppermost metal layer of the lower chip. For example, when the bonding metals include copper (Cu), Cu-to-Cu bonding may be utilized. Example embodiments, however, are not limited thereto. For example, the bonding metals may also be formed of aluminum (Al) or tungsten (W).

Each of the peripheral region PREG and the cell region CREG of the nonvolatile memory device 2000 may include an external pad bonding area PA, a wordline bonding area WLBA, and a bitline bonding area BLBA.

The peripheral region PREG may include a first substrate 2210, an interlayer insulating layer 2215, circuit elements 2220a, 2220b, and 2220c formed on the first substrate 2210, first metal layers 2230a, 2230b, and 2230c respectively connected to the circuit elements 2220a, 2220b, and 2220c, and second metal layers 2240a, 2240b, and 2240c formed on the first metal layers 2230a, 2230b, and 2230c. In some embodiments, the first metal layers 2230a, 2230b, and 2230c may be formed of tungsten having relatively high electrical resistivity, and the second metal layers 2240a, 2240b, and 2240c may be formed of copper having relatively low electrical resistivity.

In some embodiments, such as the embodiment of FIG. 20, although only the first metal layers 2230a, 2230b, and 2230c and the second metal layers 2240a, 2240b, and 2240c are shown and described, example embodiments are not limited thereto. For example, in some embodiments, one or more additional metal layers may be further formed on the second metal layers 2240a, 2240b, and 2240c. At least a portion of the one or more additional metal layers formed on the second metal layers 2240a, 2240b, and 2240c may be formed of, for example, aluminum or the like having a lower electrical resistivity than those of copper forming the second metal layers 2240a, 2240b, and 2240c.

The interlayer insulating layer 2215 may be disposed on the first substrate 2210 and cover the circuit elements 2220a, 2220b, and 2220c, the first metal layers 2230a, 2230b, and 2230c, and the second metal layers 2240a, 2240b, and 2240c. The interlayer insulating layer 2215 may include or may be formed of an insulating material such as, for example, silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral region PREG may be electrically bonded to upper bonding metals 2371b and 2372b of the cell region CREG. The lower bonding metals 2271b and 2272b and the upper bonding metals 2371b and 2372b may be formed of, for example, aluminum, copper, tungsten, or the like. The upper bonding metals 2371b and 2372b in the cell region CREG may be referred to as first metal pads, and the lower bonding metals 2271b and 2272b in the peripheral region PREG may be referred to as second metal pads.

The cell region CREG may include at least one memory block. The cell region CREG may include a second substrate 2310 and a common source line 2320. On the second substrate 2310, wordlines 2331, 2332, 2333, 2334, 2335, 2336, 2337, and 2338 (collectively, 2330) may be vertically stacked (in the direction D3 or a Z-axis) perpendicular to an upper surface of the second substrate 2310. At least one string selection line and at least one ground selection line may be arranged on and below the wordlines 2330, respectively, and the wordlines 2330 may be disposed between the at least one string selection line and the at least one ground selection line.

In the bitline bonding area BLBA, a channel structure CH may vertically extend perpendicular to the upper surface of the second substrate 2310, and pass through the wordlines 2330, the at least one string selection line, and the at least one ground selection line. The channel structure CH may include, for example, a data storage layer, a channel layer, a buried insulating layer, and the like. The channel layer may be electrically connected to a first metal layer 2350c and a second metal layer 2360c. For example, the first metal layer 2350c may be a bitline contact, and the second metal layer 2360c may be a bitline. In an example embodiment, the bitline (the second metal layer 2360c) may extend in a second horizontal direction D2 (e.g., a Y-axis direction) parallel to the upper surface of the second substrate 2310.

In the illustrated example of FIG. 20, an area in which the channel structure CH, the bitline (the second metal layer 2360c), and the like are disposed may be defined as the bitline bonding area BLBA. In the bitline bonding area BLBA, the bitline (the second metal layer 2360c) may be electrically connected to the circuit elements 2220c providing a page buffer 2393 in the peripheral region PREG. The bitline (the second metal layer 2360c) may be connected to upper bonding metals 2371c and 2372c in the cell region CREG, and the upper bonding metals 2371c and 2372c may be connected to lower bonding metals 2271c and 2272c connected to the circuit elements 2220c of the page buffer 2393.

In the wordline bonding area WLBA, the wordlines 2330 may extend in a first horizontal direction D1 (e.g., an X-axis direction) parallel to the upper surface of the second substrate 2310 and perpendicular to the second horizontal direction D2, and may be connected to cell contact plugs 2341, 2342, 2343, 2344, 2345, 2346, and 2347 (collectively, 2340). The wordlines 2330 and the cell contact plugs 2340 may be connected to each other in pads provided by at least a portion of the wordlines 2330 extending in different lengths in the first horizontal direction D1. A first metal layer 2350b and a second metal layer 2360b may be connected to an upper portion of the cell contact plugs 2340 connected to the wordlines 2330, sequentially. The cell contact plugs 2340 may be connected to the peripheral region PREG by the upper bonding metals 2371b and 2372b of the cell region CREG and the lower bonding metals 2271b and 2272b of the peripheral region PREG in the wordline bonding area WLBA.

The cell contact plugs 2340 may be electrically connected to the circuit elements 2220b forming a row decoder 2394 in the peripheral region PREG. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as, for example, a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

I/O pads 2205 and 2305 may be disposed in the external pad bonding area PA. A lower insulating film 2201 covering a lower surface of the first substrate 2210 may be formed below the first substrate 2210, and a first I/O pad 2205 may be formed on the lower insulating film 2201. The first I/O pad 2205 may be connected to at least one of the circuit elements 2220a, 2220b, and 2220c disposed in the peripheral region PREG through a first I/O contact plug 2203, and may be separated from the first substrate 2210 by the lower insulating film 2201. In addition, a side insulating film may be disposed between the first I/O contact plug 2203 and the first substrate 2210 to electrically separate the first I/O contact plug 2203 and the first substrate 2210.

An upper insulating film 2301 covering the upper surface of the second substrate 2310 may be formed on the second substrate 2310, and a second I/O pad 2305 may be disposed on the upper insulating film 2301. The second I/O pad 2305 may be connected to at least one of the circuit elements 2220a, 2220b, and 2220c disposed in the peripheral region PREG through a second I/O contact plug 2303. In some embodiments, the second I/O pad 2305 is electrically connected to a circuit element 2220a.

In some embodiments, the second substrate 2310 and the common source line 2320 are not disposed in an area in which the second I/O contact plug 2303 is disposed. Also, in some embodiments, the second I/O pad 2305 does not overlap the wordlines 2330 in the vertical direction D3 (e.g., the Z-axis direction). The second I/O contact plug 2303 may be separated from the second substrate 2310 in the direction parallel to the upper surface of the second substrate 310, and may pass through the interlayer insulating layer 2315 of the cell region CREG to be connected to the second I/O pad 2305.

According to some embodiments, the first I/O pad 2205 and the second I/O pad 2305 may be selectively formed. For example, in some embodiments, the nonvolatile memory device 2000 may include only the first I/O pad 2205 disposed on the first substrate 2210 or the second I/O pad 2305 disposed on the second substrate 2310. In some embodiments, the memory device 200 may include both the first I/O pad 2205 and the second I/O pad 2305.

A metal pattern provided on an uppermost metal layer may be provided as a dummy pattern or the uppermost metal layer may be absent, in each of the external pad bonding area PA and the bitline bonding area BLBA, respectively included in the cell region CREG and the peripheral region PREG.

In the external pad bonding area PA, the nonvolatile memory device 2000 may include a lower metal pattern 2273a, corresponding to an upper metal pattern 2372a formed in an uppermost metal layer of the cell region CREG, and having the same cross-sectional shape as the upper metal pattern 2372a of the cell region CREG so as to be connected to each other, in an uppermost metal layer of the peripheral region PREG. In some embodiments, in the peripheral region PREG, the lower metal pattern 2273a formed in the uppermost metal layer of the peripheral region PREG is not connected to a contact. In similar manner, in the external pad bonding area PA, an upper metal pattern 2372a, corresponding to the lower metal pattern 2273a formed in an uppermost metal layer of the peripheral region PREG, and having the same shape as a lower metal pattern 2273a of the peripheral region PREG, may be formed in an uppermost metal layer of the cell region CREG.

The lower bonding metals 2271b and 2272b may be formed on the second metal layer 2240b in the wordline bonding area WLBA. In the wordline bonding area WLBA, the lower bonding metals 2271b and 2272b of the peripheral region PREG may be electrically connected to the upper bonding metals 2371b and 2372b of the cell region CREG by, for example, Cu-to-Cu bonding.

Further, in the bitline bonding area BLBA, an upper metal pattern 2392, corresponding to a lower metal pattern 2252 formed in the uppermost metal layer of the peripheral region PREG, and having the same cross-sectional shape as the lower metal pattern 2252 of the peripheral region PREG, may be formed in an uppermost metal layer of the cell region CREG. In some embodiments, a contact is not formed on the upper metal pattern 2392 formed in the uppermost metal layer of the cell region CREG.

FIG. 21 is a conceptual diagram illustrating manufacturing processes of the nonvolatile memory device of FIG. 20, according to some embodiments.

Referring to FIG. 21, respective integrated circuits may be formed on a first wafer WF1 and a second wafer WF2. The memory cell array may be formed in the first wafer WF1 and the peripheral circuits may be formed in the second wafer WF2.

After the various integrated circuits have been respectively formed on the first and second wafers WF1 and WF2, the first wafer WF1 and the second wafer WF2 may be bonded together. The bonded wafers WF1 and WF2 may then be cut (or divided) into separate chips, in which each chip corresponds to a semiconductor device such as, for example, the nonvolatile memory device 2000, including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to the second semiconductor die SD2.

As described above, the semiconductor package and the method of providing the surface temperature of the semiconductor package according to example embodiments may provide the surface temperature efficiently and accurately based on the calibration information indicating the mapping relationships between the plurality of reference temperatures and the plurality of reference code values. In addition, the accurate surface temperature may be provided by generating the calibration information corresponding to each semiconductor package using the temperature measurement circuit integrated in the semiconductor die of each semiconductor package without an additional temperature sensor to measure the surface temperature. Further, the surface temperature may be provided efficiently without excessive increase in test time by generating the calibration information at the test temperatures during the burn-in test.

The example embodiments may be applied to any electronic devices and systems manufactured in a form of semiconductor package. For example, the example embodiments may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive driving system, etc.

The foregoing is illustrative of example embodiments and is not to be construed as limiting thereof. Although a few example embodiments have been described, those skilled in the art will readily appreciate that many modifications are possible in the example embodiments without materially departing from the present disclosure.

What is claimed is:

1. A method of providing a surface temperature of a semiconductor package including at least one semiconductor die that is packaged using a molding material, the method comprising:
    setting an air temperature near the semiconductor package to each of a plurality of reference temperatures;
    measuring a plurality of reference code values respectively corresponding to the plurality of reference temperatures based on a temperature code indicating a junction temperature in the at least one semiconductor die while the air temperature is set to each of the plurality of reference temperatures, the temperature code being provided from a reference temperature measurement circuit integrated in the semiconductor package;
    generating calibration information that indicates mapping relationships between the plurality of reference temperatures and the plurality of reference code values; and
    providing a present surface temperature of the semiconductor package based on the calibration information and a present code value of the temperature code.

2. The method of claim 1, wherein providing the present surface temperature includes:
    storing the calibration information in a nonvolatile memory included in the semiconductor package; and
    providing the present surface temperature based on the calibration information that is read from the nonvolatile memory.

3. The method of claim 1, wherein measuring the plurality of reference code values includes:
    determining a plurality of measurement time points based on a soak time such that the surface temperature of the semiconductor package becomes equal to the air temperature after the soak time from when the air temperature is set to each of the plurality of reference temperatures; and
    measuring the plurality of reference code values respectively at the plurality of measurement time points.

4. The method of claim 1, wherein the calibration information is provided during a monitoring burn-in test of the semiconductor package.

5. The method of claim 4, wherein the air temperature corresponds to a temperature in a test chamber in which the semiconductor package is mounted for the monitoring burn-in test.

6. The method of claim 4, wherein the plurality of reference temperatures are test temperatures for the monitoring burn-in test.

7. The method of claim 4, wherein after the monitoring burn-in test, one or more other tests are controlled based on the calibration information.

8. The method of claim 1, wherein providing the present surface temperature includes:
    determining a conversion function based on the calibration information;
    inputting the present code value of the temperature code to the conversion function and receiving an output value from the conversion function; and
    providing the present surface temperature corresponding to the output value of the conversion function.

9. The method of claim 1, wherein the present surface temperature is provided based on following expression:

$$Y = A \cdot X + B,$$

$$A = (TRi - TRk)/(CVi - CVk), \text{ and}$$

$$B = (CVk \cdot TRi - CVi \cdot TRk)/(CVk - CVi),$$

where TRi and TRk denote two reference temperatures among the plurality of reference temperatures, CVi and CVk denote two reference code values corresponding to Tri and TRk respectively, X denotes the present code value of the temperature code, and Y denotes the present surface temperature of the semiconductor package.

10. The method of claim 1, wherein the semiconductor package includes a plurality of semiconductor dies that are stacked in a vertical direction, and
wherein the reference temperature measurement circuit is integrated in an uppermost semiconductor die among the plurality of semiconductor dies.

11. A method of providing a surface temperature of a semiconductor package including at least one semiconductor die that is packaged using molding material, the method comprising:
setting an air temperature in a test chamber in which the semiconductor package is mounted for a burn-in test to a first reference temperature;
measuring a first reference code value corresponding to the first reference temperature based on a temperature code indicating a junction temperature in the at least one semiconductor die while the air temperature is set to the first reference temperature, the temperature code being provided from a reference temperature measurement circuit integrated in the semiconductor package;
setting the air temperature in the test chamber to a second reference temperature;
measuring a second reference code value corresponding to the second reference temperature based on the temperature code while the air temperature is set to the second reference temperature;
generating calibration information indicating a first mapping relationship between the first reference temperature and the first reference code value and a second mapping relationship between the second reference temperature and the second reference code value;
determining a linear conversion function based on the calibration information;
inputting a present code value of the temperature code to the linear conversion function and receiving an output value from the linear conversion function; and
providing a present surface temperature of the semiconductor package corresponding to the output value of the linear conversion function.

12. The method of claim 11, wherein the first reference code value is measured after a soak time has elapsed from when the air temperature is set to the first reference temperature, and the second reference code value is measured after the soak time has elapsed from when the air temperature is set to the second reference temperature, such that the surface temperature of the semiconductor package becomes equal to the air temperature after the soak time.

13. The method of claim 11, wherein the present surface temperature is provided based on following expression:

$$Y = A \cdot X + B,$$

$$A = (TRh - TRc)/(CVh - CVc), \text{ and}$$

$$B = (CVc \cdot TRh - CVh \cdot TRc)/(CVc - CVh),$$

where TRh and TRc denote the first reference temperature and the second reference temperature respectively, CVh and CVc denote the first reference code value and the second reference code value respectively, X denotes the present code value of the temperature code, and Y denotes the present surface temperature of the semiconductor package.

14. The method of claim 11, further comprising:
storing the calibration information in a nonvolatile memory included in the semiconductor package.

15. A semiconductor package comprising:
a base substrate;
at least one semiconductor die stacked on the base substrate;
molding material covering the base substrate and the at least one semiconductor die;
a reference temperature measurement circuit integrated in the at least one semiconductor die and configured to generate a temperature code indicating a junction temperature in the at least one semiconductor die; and
a calibration logic configured to generate a present surface temperature of the molding material based on a present reference code value of the temperature code and calibration information indicating mapping relationships between a plurality of reference temperatures and a plurality of reference code values of the temperature code respectively corresponding to the plurality of reference temperatures.

16. The semiconductor package of claim 15, wherein the calibration information is generated based on the temperature code while an air temperature in a test chamber in which the semiconductor package is mounted for a monitoring burn-in test is set to each of the plurality of reference temperatures.

17. The semiconductor package of claim 15, further comprising:
a nonvolatile memory configured to store the calibration information.

18. The semiconductor package of claim 15, wherein the calibration logic is configured to provide the present surface temperature based on following expression:

$$Y = A \cdot X + B,$$

$$A = (TRi - TRk)/(CVi - CVk), \text{ and}$$

$$B = (CVk \cdot TRi - CVi \cdot TRk)/(CVk - CVi),$$

where TRi and TRk denote two reference temperatures among the plurality of reference temperatures, CVi and CVk denote two reference code values corresponding to Tri and TRk respectively, X denotes a present code value of the temperature code, and Y denotes the present surface temperature of the semiconductor package.

19. The semiconductor package of claim 15, wherein the semiconductor package includes a plurality of semiconductor dies that are stacked in a vertical direction, and
wherein the reference temperature measurement circuit is integrated in an uppermost semiconductor die among the plurality of semiconductor dies.

20. The semiconductor package of claim 15, wherein the at least one semiconductor die includes a logic semiconductor die and a plurality memory semiconductor die stacked in a vertical direction, and wherein the reference temperature measurement circuit measures the plurality of reference code values while the logic semiconductor die is disabled.

* * * * *